(12) United States Patent
Aston et al.

(10) Patent No.: US 11,015,872 B2
(45) Date of Patent: May 25, 2021

(54) ADDITIVELY MANUFACTURED HEAT TRANSFER DEVICE

(71) Applicant: The Boeing Company, Chicago, IL (US)

(72) Inventors: Richard W. Aston, Brea, CA (US); Matthew Joseph Herrmann, Rancho Palos Verdes, CA (US); Michael John Langmack, Huntington Beach, CA (US); Nicole M. Hastings, Redondo Beach, CA (US); Sumit K. Purohit, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 39 days.

(21) Appl. No.: 16/024,582

(22) Filed: Jun. 29, 2018

(65) Prior Publication Data
US 2020/0003497 A1 Jan. 2, 2020

(51) Int. Cl.
*F28D 7/00* (2006.01)
*H01Q 13/00* (2006.01)

(52) U.S. Cl.
CPC ........... *F28D 7/0033* (2013.01); *H01Q 13/00* (2013.01)

(58) Field of Classification Search
CPC ........... F28D 2021/0028; F28D 7/0016; F28D 7/0033; F28D 7/0066; H01L 23/473; H05K 7/20254; H05K 7/20272; F28F 7/00; F28F 7/02
USPC .................... 165/138, 80.4, 104.33; 361/699
See application file for complete search history.

(56) References Cited

U.S. PATENT DOCUMENTS

| | | | | |
|---|---|---|---|---|
| 5,016,090 A | * | 5/1991 | Galyon | ............... H01L 23/4336 257/714 |
| 7,764,494 B2 | * | 7/2010 | Balzano | ............... H01L 23/473 165/104.22 |
| 2003/0066636 A1 | * | 4/2003 | Kawakubo | .............. F25B 40/00 165/164 |

(Continued)

FOREIGN PATENT DOCUMENTS

| | | |
|---|---|---|
| EP | 2977701 A1 | 1/2016 |
| EP | 2977702 A1 | 1/2016 |

(Continued)

OTHER PUBLICATIONS

European Patent Office, Extended European Search Report regarding European Patent Application No. 19171665.3-1008, dated Nov. 21, 2019, 6 pages.

*Primary Examiner* — Jianying C Atkisson
*Assistant Examiner* — Jose O Class-Quinones
(74) *Attorney, Agent, or Firm* — Kolisch Hartwell, P.C.

(57) ABSTRACT

An additively manufactured heat transfer device is disclosed, including an enclosure portion with outer walls. The outer walls contain an inner channel configured to direct a flow of coolant fluid. The heat transfer device further includes a fluid intake port and a fluid outtake port, each connected to the first inner channel. The fluid intake port is configured to direct a flow of coolant fluid through an outer wall of the enclosure portion into the inner channel, and the fluid outtake port is configured to direct a flow of coolant fluid through an outer wall of the enclosure portion out of the inner channel. The inner channel is defined by internal walls, and the enclosure portion and the internal walls form a single additively manufactured unit.

20 Claims, 8 Drawing Sheets

(56) References Cited

U.S. PATENT DOCUMENTS

| | | | |
|---|---|---|---|
| 2003/0173720 A1* | 9/2003 | Musso | C04B 38/0006 264/635 |
| 2004/0069451 A1* | 4/2004 | Meyer | F28F 3/12 165/80.2 |
| 2005/0121173 A1* | 6/2005 | Inagaki | F28D 1/0325 165/80.3 |
| 2005/0217823 A1* | 10/2005 | Osanai | B22D 19/0072 165/80.2 |
| 2007/0158050 A1* | 7/2007 | Norley | H01L 23/473 165/80.4 |
| 2007/0227697 A1* | 10/2007 | Takahashi | H01L 23/473 165/80.4 |
| 2015/0201529 A1* | 7/2015 | Wicks | H01L 23/4006 165/80.3 |
| 2017/0205149 A1* | 7/2017 | Herring | B22F 3/1055 |

FOREIGN PATENT DOCUMENTS

| | | |
|---|---|---|
| WO | 2016196929 A2 | 12/2016 |
| WO | 2016196929 A3 | 12/2016 |
| WO | 2017052798 A1 | 3/2017 |

\* cited by examiner

ADDITIVELY MANUFACTURED HEAT TRANSFER DEVICE

FIELD

This disclosure relates to systems and methods for transferring heat. More specifically, the disclosed embodiments relate to cold plates for electronics systems.

INTRODUCTION

Thermal management is a growing field, partially driven by advancements in electronics design that result in greater heat flux density from smaller and more powerful equipment. Effective thermal management improves both performance and reliability of electronics, and can be critical to system function. For instance, satellite circuit boards are highly power dense and rely on redundant thermal systems to provide necessary heat dissipation even when regular maintenance is not possible. Thermal management is also important in many other industries involving other heat generating mechanical and/or chemical processes.

A variety of cooling technologies have been developed, but use of a liquid coolant is particularly effective due to a high heat transfer coefficient. Often, liquid cooling is accomplished with a cold plate, a conductive plate that acts as a heat transfer interface between a heat source and channels of flowing liquid coolant. However, existing cold plate systems can be expensive and prone to leakage.

Efficient cold plates can have complex internal geometries and delicate structures such as micro-channels, which result in costly and time-consuming manufacture. In traditional manufacturing methods, forming channels for coolant flow typically requires joining through welding, brazing, or mechanical fastening. Such joins complicate manufacture and may be more prone to failure. For function-critical thermal management systems, a failure can have costly consequences.

SUMMARY

The present disclosure provides systems, apparatuses, and methods relating to additively manufactured heat transfer devices. In some embodiments, a heat transfer device may include an enclosure portion having outer walls. The outer walls may contain an inner channel configured to direct a flow of coolant fluid. The heat transfer device may further include a fluid intake port and a fluid outtake port, each connected to the first inner channel. The fluid intake port may be configured to direct a flow of coolant fluid through an outer wall of the enclosure portion into the inner channel, and the fluid outtake port may be configured to direct a flow of coolant fluid through an outer wall of the enclosure portion out of the inner channel. The inner channel may be defined by internal walls, and the enclosure portion and the internal walls may form a single additively manufactured unit.

In some embodiments, a heat transfer device may include a housing having a planar heat transfer face, and an internal wall structure forming a channel inside the housing. The channel may be configured to conduct heat from the heat transfer face to a fluid. The housing and internal wall structure may form a single additively manufactured unit.

A method of manufacturing a heat transfer device may include printing a housing having an external heat transfer face. The method may further include printing an internal wall structure that defines an inner channel. The inner channel may be configured to channel fluid for cooling the heat transfer face.

Features, functions, and advantages may be achieved independently in various embodiments of the present disclosure, or may be combined in yet other embodiments, further details of which can be seen with reference to the following description and drawings.

DETAILED DESCRIPTION

Various aspects and examples of heat transfer devices and related systems and methods are described below and illustrated in the associated drawings. Unless otherwise specified, a heat transfer device in accordance with the present teachings, and/or its various components may, but are not required to, contain at least one of the structures, components, functionalities, and/or variations described, illustrated, and/or incorporated herein. Furthermore, unless specifically excluded, the process steps, structures, components, functionalities, and/or variations described, illustrated, and/or incorporated herein in connection with the present teachings may be included in other similar devices and methods, including being interchangeable between disclosed embodiments. The following description of various examples is merely illustrative in nature and is in no way intended to limit the disclosure, its application, or uses. Additionally, the advantages provided by the examples and embodiments described below are illustrative in nature and not all examples and embodiments provide the same advantages or the same degree of advantages.

This Detailed Description includes the following sections, which follow immediately below: (1) Overview; (2) Examples, Components, and Alternatives; (3) Illustrative Combinations and Additional Examples; (4) Advantages, Features, and Benefits; and (5) Conclusion. The Examples, Components, and Alternatives section is further divided into subsections A through F, each of which is labeled accordingly.

Overview

In general, a heat transfer device in accordance with the present teachings may include a metal structure with a first surface configured for thermal communication with an electronics system and a second surface configured for thermal communication with a fluid. The heat transfer device may be configured to conduct heat from the electronics system to the fluid. The heat transfer device may be a single additively manufactured unit. The heat transfer device may also be referred to as a heat dissipation device, a heat exchanger, a heat sink, and/or a cold plate.

Figure 1:
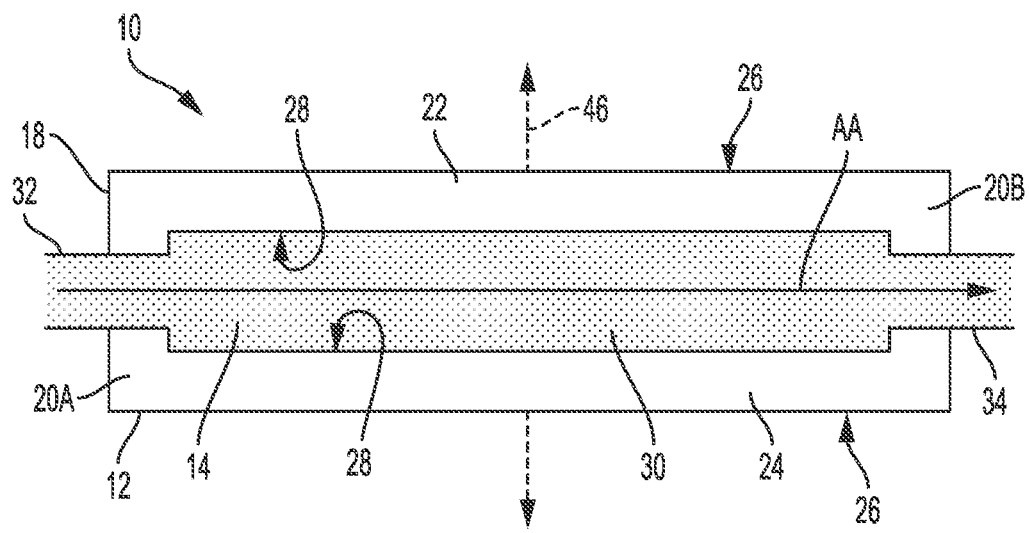
FIG. 1 is a schematic diagram of an illustrative additively manufactured cold plate in accordance with aspects of the present disclosure.
Figure 2:
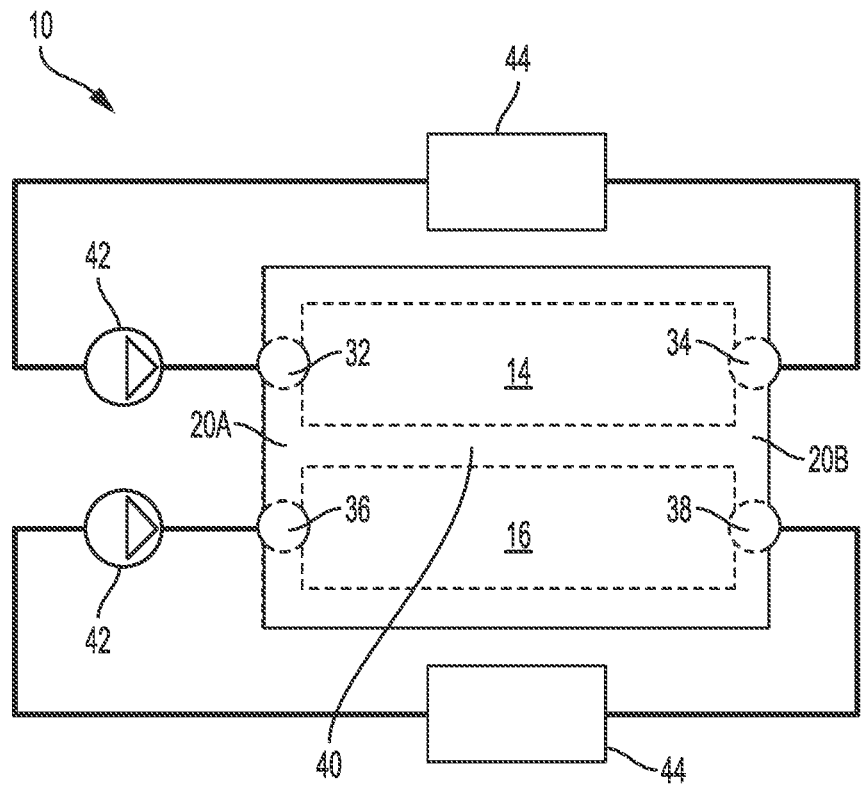
FIG. 2 is another schematic diagram of the cold plate of FIG. 1.

FIGS. 1 and 2 are schematic diagrams of an illustrative cold plate 10, which includes an enclosure portion or housing 12 having a first inner channel 14 and a second inner channel 16. FIG. 1 is diagram of a cross-section of the cold plate, through the housing and the first inner channel. Housing 12 includes outer walls 18 that contain the first and second inner channels, and includes side walls 20A, 20B and a conductive wall 22. In the present example, the outer walls further include a second conductive wall 24. Conductive walls 22, 24 may also be referred to as heat transfer sides, thermal plates, and/or heat sinks. In some examples, conductive wall 22 may be referred to as a cold plate and cold plate 10 may be referred to as a cold plate system or heat dissipation device.

First conductive wall 22 and second conductive wall 24 are opposing, and each include an external heat transfer surface 26 and an internal heat transfer surface 28. The external transfer surface is configured to directly or indirectly contact a heat source, thereby allowing the respective conductive wall to conduct heat away from the source. The internal transfer surface may be referred to as forming a portion of each inner channel 14, 16 and/or being in contact with each inner channel. The internal transfer surface contacts a coolant fluid 30, and allows heat to be conducted from the conductive wall into the coolant fluid.

Each conductive wall 22, 24 has a thickness, which may be defined as an average distance between external transfer surface 26 and internal transfer surface 28. The thickness of the conductive wall may be determined by desired thermal properties of cold plate 10 in combination with corresponding thermal properties of a material or materials of the conductive wall and of the coolant. The thickness of each conductive wall may also be defined as a distance between external heat transfer surface 26 and internal transfer surface 28 at any particular point, and may vary over the conductive wall. The thickness of each conductive wall may vary according to a pattern corresponding to the heat source, according to a pattern having a desirable thermal effect, and/or as a result of a selected shape of the inner channels.

Each external heat transfer surface 26 may be substantially planar, shaped according to desired thermal properties, and/or shaped to conform to a surface of a heat source. Housing 12 may be generally rectangular, shaped according to desired thermal properties, and/or shaped to correspond to the heat source surface. In some examples, housing 12 may be configured for thermal communication with the heat source through an intermediate component such as a heat spreader and/or thermal paste.

As shown in FIG. 1, a first fluid intake port 32 and a first fluid outtake port 34 are connected to channel 14. Coolant fluid 30 is directed through a side wall 20A into channel 14 by intake port 32, and then out of the channel through another side wall 20B by outtake port 34. The coolant flows through channel 14 as indicated by arrow AA. In the depicted example, the coolant flows straight across cold plate 10 in a single stream. In some examples, coolant flow AA may double back and/or include branching streams. The coolant fluid may flow parallel to conductive walls 22, 24 and/or transfer surfaces 26. Any flow pattern may be used, as defined by a path or configuration of channel 14.

Inner channel 14 may have any cross-sectional shape and/or any path contained by outer walls 18. The channel may be configured to provide a desired flow pattern, accommodate a particular coolant type, and/or to facilitate additive manufacture without interior secondary supports. For example, inner channel 14 may have a diamond cross-sectional shape. For another example, inner channel 14 may have curved corners and a cross-sectional dimension selected to facilitate laminar flow of a high-viscosity coolant fluid.

Intake port 32 and outtake port 34 may be any appropriate structure, including but not limited to valves, mechanical fittings, and/or digital flow controls. The ports may be manufactured as part of housing 12, or may be separately manufactured and installed into the housing. In some examples, housing 12 may include a threaded aperture or other feature configured to mate with standard port parts.

As shown in FIG. 2, second inner channel 16 is connected to a second fluid intake port 36 and a second fluid outtake port 38. FIG. 2 is a schematic plan view of cold plate 10, showing the first and second inner channels as dashed to indicate their disposition behind conductive wall 22. First inner channel 14 is separated from second inner channel 16 by an internal wall structure 40 of housing 12. In the present example, inner wall structure 40 is a single wall, spanning between side wall 20A and side wall 20B to define rectangular inner channels 14, 16. Inner wall structure 40 may include multiple walls, to define any desired shape and/or path of one or more inner channels.

First inner channel 14 is not in fluid communication with second fluid channel 16, but there may be thermal communication between the channels. The two inner channels may each provide equivalent cooling functionality to cold plate 10, may fulfill distinct cooling functions, and/or may constitute primary and back-up systems. Cold plate 10 may include any appropriate number of separate inner channels. Each inner channel may contact or comprise a portion of internal transfer surface 28 of either conductive wall 22 or conductive wall 24, or may contact or comprise a portion of the internal transfer surfaces of both conductive walls. The inner channels may be referred to as contacting one or both conductive walls.

Coolant fluid 30 is supplied to first inner channel 14 by a first fluid system including a pump 42 and a coolant fluid source 44. Coolant fluids may include, but are not limited to dielectric liquid coolants such as silicone oils, non-dielectric liquid coolants such as aqueous solutions of ethylene glycol, and/or newer coolants such as nanofluids or ionic liquids. In the depicted example, coolant fluid source 44 recycles coolant fluid output from outtake port 34. Source 44 may be configured to transfer heat from the output coolant fluid to ambient air, to a waste heat recovery unit, and/or to any appropriate system. In some examples, coolant fluid 30 and/or some portion of the coolant fluid may undergo a phase change as a result of heat absorbed from cold plate 10. In such examples, source 44 may be configured to return coolant fluid 30 to a liquid phase. Any appropriate coolant fluid source may be used.

Coolant fluid 30 is supplied to second inner channel 16 by a second fluid system with a separate pump 42 and coolant fluid source 44. In some examples, second inner channel 16 may be supplied with a different coolant fluid and/or a coolant fluid at a different temperature, pressure, etc. Second inner channel 16 and the second fluid system may provide fail-safe redundancy to cold plate 10. The cold plate may be configured for concurrent or alternate use of the first and second fluid systems. In some examples, cold plate 10 may provide consistent cooling prior to and subsequent to failure of one of the fluid systems. In some examples, cold plate 10 may provide reduced but sufficient cooling subsequent to failure of one of the fluid systems.

Cold plate 10 may include further structures not depicted in FIGS. 1 and 2. For example, the cold plate may include attachment features configured to attach the cold plate directly or indirectly to a heat source. For instance, tabs with fastener apertures may be formed on side walls 20A, 20B to allow cold plate 10 to be fastened to an electronics system. For another instance, conductive wall 24 may be replaced by an integrated I-beam structure configured to act as a structural beam of an electronics case.

In another example, cold plate 10 may include structures with radio frequency (RF) functionality or structures configured to interface with a transmitter, receiver, and/or transceiver. For instance, housing 12 may be shaped to act as an antenna and include an adaptor for an amplifier connection. For another instance, cold plate 10 may include apertures extending through the cold plate from external transfer surface 26 of conductive wall 24 to external transfer surface 26 of conductive wall 22, the apertures being separated from the inner channels by inner wall structure 40 and configured to guide radio frequency transmissions.

Cold plate 10 includes a thermally conductive material, which may be a laser sintered metal or a fused deposition molded metal. In some examples, the cold plate may include aluminum, copper, titanium, and/or an alloy thereof. The cold plate may include multiple materials, or may be produced from a single material. Thermal conductivity, specific heat, density, and phase transition temperatures, along with other factors, may be considered in selecting a material or combination of materials for cold plate 10. Appropriate or desirable materials may depend on an intended application of the cold plate, and a selected additive manufacturing method.

Referring again to FIG. 1, cold plate 10 has a manufacturing orientation defined by an axis 46, which may be perpendicular to conductive wall 22, conductive wall 24, and/or either external transfer surface 26. In some examples, manufacturing axis 46 may be a vertical axis. In some examples, manufacturing axis 46 may be chosen according to a shape of inner channels 14, 16 such that the inner channels are effectively diamond shaped with respect to the manufacturing orientation. For instance, manufacturing axis 46 may form an angle of approximately 45 degrees relative to a side of a square inner channel.

Cold plate 10 may comprise a plurality of layers, each layer being generally perpendicular to manufacturing axis 46. Each layer may be thin and planar, and fused to or otherwise cohesive with adjacent layers. Variation from one layer to an adjacent layer may be limited. That is, dimensions of cold plate 10 may change gradually along manufacturing axis 46. The cold plate may include no abrupt overhangs, where an abrupt overhang may be described as any downward-facing surface forming an angle of greater than approximately 45 degrees or greater than approximately 50 degrees with manufacturing axis 46. All features of cold plate 10 may therefore be printed without need for secondary supports.

In some examples, limited external secondary supports may be used when cold plate 10 has a manufacturing orientation with a corner of housing 12 contacting a base plate of the additive manufacturing equipment. Such a manufacturing orientation may be selected to preclude any need for internal secondary supports in inner channels 14, 16.

In some examples, cold plate 10 may be post-processed from an additively manufactured blank. Abrupt overhangs or other features inappropriate to additive manufacture may formed by machining or otherwise post-processing the blank. In such examples, the additively manufactured blank may include no abrupt overhangs and may be printed without use of secondary supports. For example, housing 12 including outer walls 18, inner wall structure 40, and inner channels 14, 16 may be printed without intake and outtake ports. Separately manufactured ports may be installed in the manufactured blank.

Thickness of any structure of cold plate 10, or an additively manufactured blank of the cold plate, may be bounded. In other words, the thickness may have an upper and/or a lower limit. Each layer of the cold plate may have limited area for any structure. The limit may be absolute or relative. For example, internal wall structure 40 of housing 12 may be limited to a thickness of less than 100 thousandths of an inch ("mils"), where 1 mil=0.001", or the wall structure may be limited to 10% of a length of the housing. Such restriction may prevent cracking or tearing of printed material due to stresses introduced in the manufacturing process and/or in subsequent cooling or other temperature fluctuation.

For another example, internal wall structure 40 may be restricted to a thickness of more than 20 mils. Such restriction may help to produce a desired print resolution and features of sufficient strength to maintain geometric integrity through the additive manufacturing process.

In some examples, cold plate 10 may be designed to have an equivalent functionality as an existing cold plate design and may be configured to connect to a generally matching coolant fluid supply and/or recycling system as the existing cold plate design.

Cold plate 10 may include additional structures, configured to facilitate functions of equipment acting as a heat source and/or to facilitate efficient additive manufacture of the cold plate. In some examples, cold plate 10 may include fewer structures or simpler structures than those described herein. For example, cold plate 10 may include only a single inner channel and associated intake and outtake ports.

Cold plate 10 may be partially or entirely unitary. In other words, housing 12, side walls 20A, 20B, conductive walls 22, 24, internal wall structure 40, inner channels 14, 16, and/or any other portions of the cold plate may comprise a single structure. The cold plate may be additively manufactured in one process, without need for assembly of separate parts. In some examples, two or more unitary sections of cold plate 10 may be separately manufactured and assembled to form the cold plate. The cold plate may also be manufactured without secondary supports that require removal after manufacture.

Cold plate 10 may have improved reliability, as a result of unitary construction. Failure modes related to connection or interaction of parts may be eliminated. For example, coolant fluid with low surface tension may not leak at connection or joins between parts. Improperly applied or temperature sensitive sealants may not cause containment failure of corrosive or toxic coolant fluids. Generally, potential for operational complications may be reduced for a cold plate with fewer components.

Cold plate 10 may have a geometry configured to be repeatable. In other words, the geometry of the cold plate may be such that when multiple copies of the plate are manufactured, each copy measures within a desired tolerance of the original design. In some examples the desired tolerance may be 1 mil, may be 10 mil, or may be any appropriate size. Manufactured copies may also be true to shape. For example, a waveguide aperture designed to be circular may be consistently printed as circular and not elliptical.

Examples, Components, and Alternatives

The following sections describe selected aspects of exemplary additively manufactured cold plates as well as related systems and/or methods. The examples in these sections are intended for illustration and should not be interpreted as limiting the entire scope of the present disclosure. Each section may include one or more distinct embodiments or examples, and/or contextual or related information, function, and/or structure.

A. Illustrative Diamond Channel Cold Plate

Figure 3:
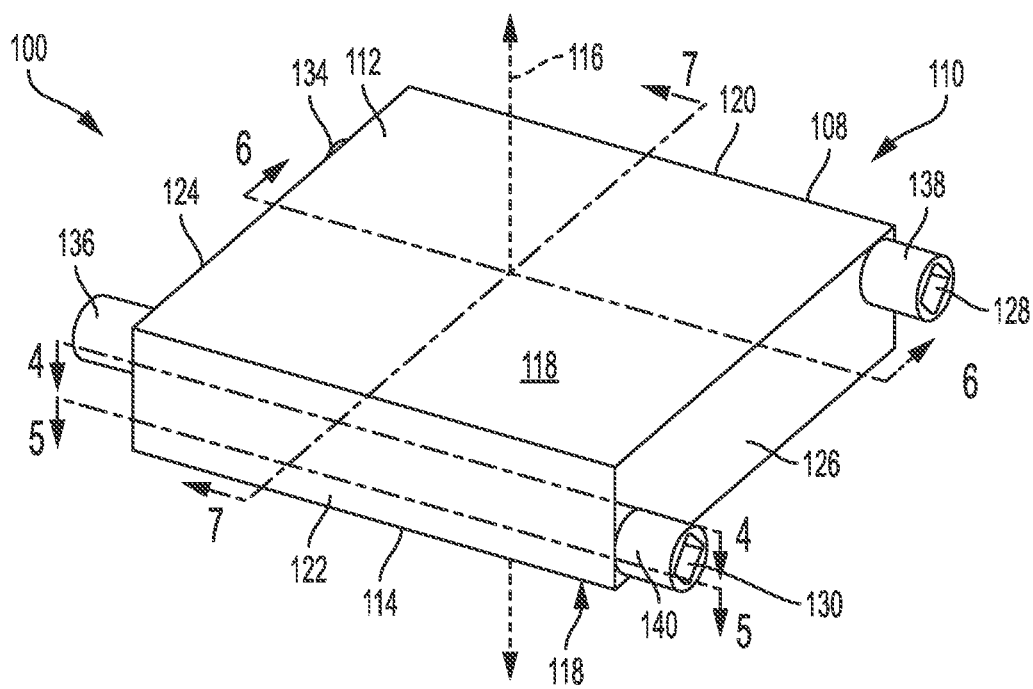
FIG. 3 is an isometric view of another illustrative cold plate as described herein.

As shown in FIGS. 3-7, this section describes an illustrative additively manufactured cold plate 100. Cold plate 100 is an example of cold plate 10, described above. As shown in FIG. 3, the cold plate includes a rectangular housing 110 with outer walls 108 including four side walls and two conductive walls. The two conductive walls may be described as a top conductive wall 112 and a bottom conductive wall 114, relative to a vertical manufacturing axis 116.

The four side walls of housing 110 may be described as a right wall 120, a left wall 122, an input wall 124, and an output wall 126. Each side wall has a planar external surface that is perpendicular to conductive walls 112, 114 and parallel to manufacturing axis 116. The side walls may also be described as vertical walls.

Each of the conductive walls 112, 114 has a planar external heat transfer surface 118. The external transfer surfaces are parallel to each other, and manufacturing axis 116 is perpendicular to the external transfer surfaces. The external transfer surfaces may also be referred to as planar heat transfer faces and/or first and second opposing heat transfer sides. Each external transfer surface is configured to contact and conduct heat away from a heat source.

For example, cold plate 100 may be used to cool an optical device mounted in a satellite, an Infrared (IR) sensor included in a security system, or an automotive battery. External transfer surfaces 118, and cold plate 100 may be shaped and sized for efficient thermal management of a given application. For electrical equipment, the cold plate may be scaled to a chip level application up to a unit level. In the present example, external transfer surfaces 118 measure approximately 1 inch by 1 inch. In some examples, the external transfer surfaces may have maximum dimensions allowed by an additive manufacturing method or printing equipment.

Cold plate 100 may be configured for manufacture by Direct Metal Laser Sintering (DMLS), metal fused deposition modeling, or any effective additive manufacturing process. The cold plate comprises an aluminum alloy in the present embodiment, but may include any conductive material or materials.

Figure 4:
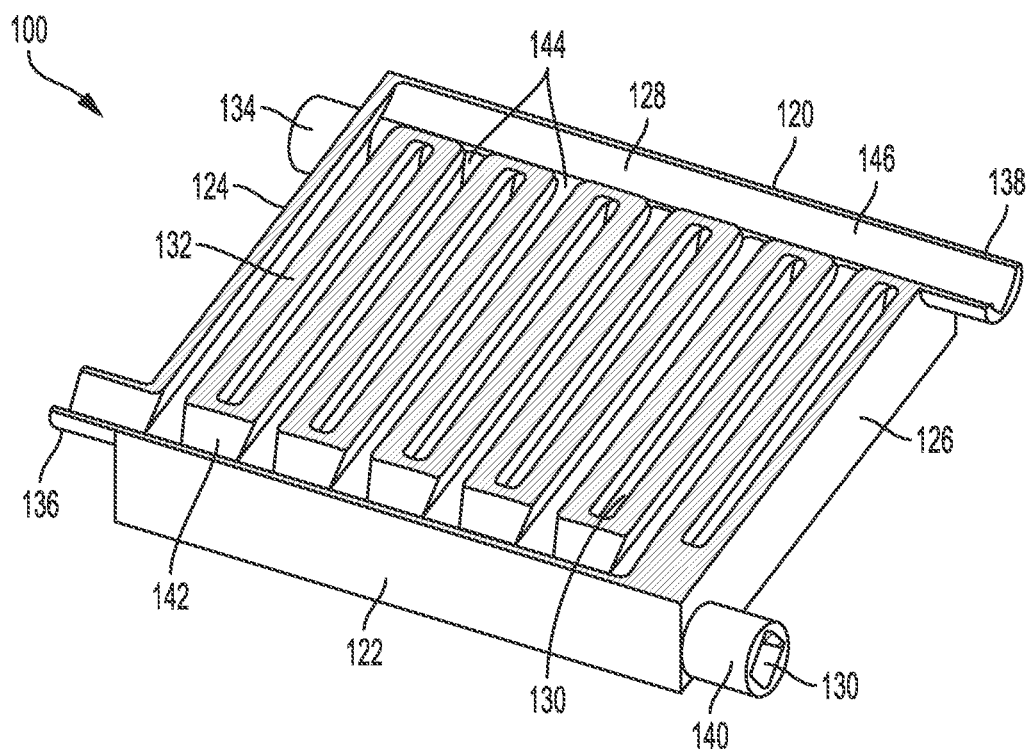
FIG. 4 is a cutaway isometric view of the cold plate of FIG. 3, cut along line 4-4.
Figure 5:
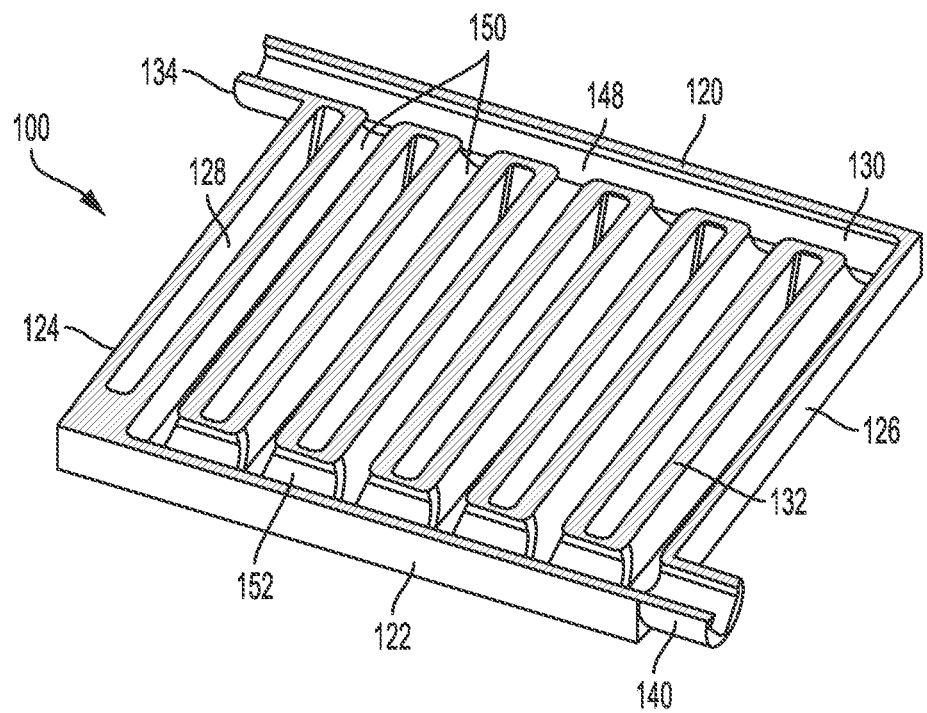
FIG. 5 is a cutaway isometric view of the cold plate of FIG. 3, cut along line 5-5.
Figure 6:
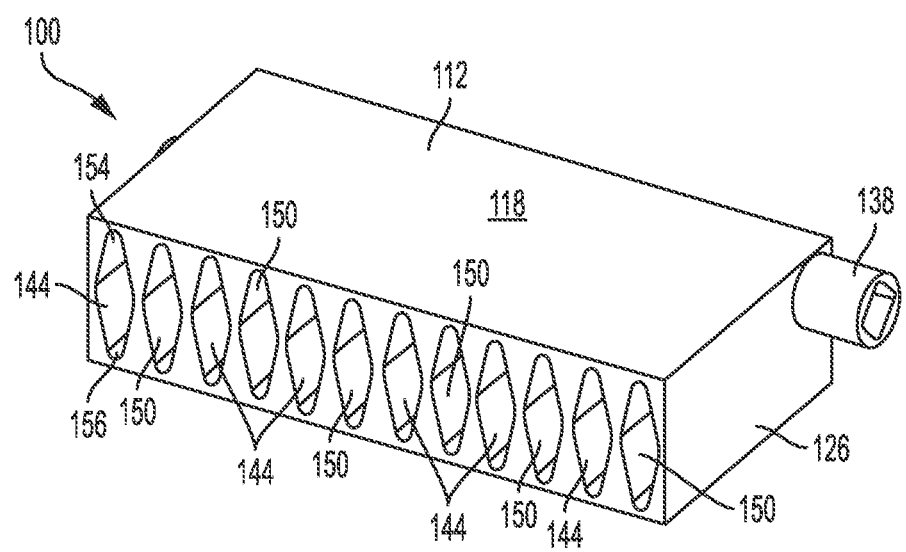
FIG. 6 is a cutaway isometric view of the cold plate of FIG. 3, cut along line 6-6.

As shown in FIG. 4, outer walls 108 of housing 110 contain a first inner channel 128. As shown in FIG. 5, the outer walls further contain a second inner channel 130. The first inner channel may be referred as an upper channel, and the second inner channel may be referred to as a lower channel. As shown in FIGS. 4-6, upper channel 128 is separated from lower channel 130 by an internal wall structure including a plurality of internal walls 132. Each channel is configured to direct a separate flow of coolant fluid through cold plate 100, parallel to external transfer surfaces 118. The channels may be used concurrently or alternately to conduct heat from external transfer surfaces 118 to the coolant fluid in one or both channels. Each channel is configured to conduct heat from both external transfer surfaces.

Referring again to FIG. 3, cold plate 100 includes two intake ports. An upper intake port 136 connects through input wall 124 to upper channel 128 and a lower intake port 134 connects through the input wall to lower channel 130. Similarly, cold plate 100 includes two outtake ports. An upper outtake port 138 connects through output wall 126 to upper channel 128 and a lower outtake port 140 connects through the output wall to lower channel 130.

In the present example, cold plate 100 is unitary. That is, outer walls 108, internal walls 132, intake ports 134 and 136, and outtake ports 138 and 140 are additively manufactured as a single-piece blank. The intake and outtake ports are then machined to form the depicted cylindrical outer surface. In some examples, outer walls 108 and internal walls 132 may form a single piece and the intake and outtake ports may be separately manufactured and fastened, welded, or otherwise fixed to the outer walls.

FIG. 4 shows cold plate 100 cut away along line 4-4 to show upper channel 128. The upper channel includes a left side-passage 142 connected to intake port 136. A plurality of cross-passages 144 branch off at regular intervals from side-passage 142 and extend across cold plate 100 to a right side-passage 146. Each side-passage extends parallel to right wall 120 and left wall 122, and parallel to the other side passage. Cross passages 144 extend perpendicular to the side-passages.

Left side-passage 142 extends from intake port 136 across a majority of cold plate 100, but stops short of output wall 126. Right side-passage 146 extends across cold plate 100 from input wall 124 to connect to outtake port 138 at output wall 126. Left side-passage 142, right side-passage 146, and cross passages 144 all extend parallel to external transfer surfaces 118.

Upper channel 128 is configured to direct a flow of coolant fluid from intake port 136 along left side-passage 142, some portion of the coolant fluid turning down each cross passage 144. The upper channel is further configured to direct the coolant fluid from cross passages 144 into right side-passage 146 and down the right side-passage to outtake port 138. Upper channel 128 is configured to transfer heat from both external transfer surfaces 118 to the directed flow of coolant fluid.

FIG. 5 shows cold plate 100 cut away along line 5-5 to show lower channel 130. The lower channel is similar to upper channel 128, but mirrored. Lower channel 130 includes a right side-passage 148 connected to intake port 134. A plurality of cross-passages 150 branch off at regular intervals from side-passage 148 and extend across cold plate 100 to a left side-passage 152. Each side-passage extends parallel to right wall 120 and left wall 122, and parallel to each other. Cross passages 150 extend perpendicular to the side-passages.

Right side-passage 148 extends from intake port 134 across cold plate 100 to output wall 126. Left side-passage 152 extends from a cross-passage 150 spaced from input wall 124 across a majority of cold plate 100 to connect to outtake port 140 at output wall 126. Left side-passage 152, right side-passage 148, and cross passages 150 all extend parallel to external transfer surfaces 118.

Lower channel 130 is configured to direct a flow of coolant fluid from intake port 134 along right side-passage 148, some portion of the coolant fluid turning down each cross passage 150. The lower channel is further configured to direct the coolant fluid from cross passages 150 into left side-passage 152 and down the left side-passage to outtake port 140. Lower channel 130 is configured to transfer heat from both external transfer surfaces 118 to the directed flow of coolant fluid.

In FIG. 6, cold plate 100 is cut away along line 6-6 to show the cross-sectional shapes of cross passages 144 and 150. Cross passages 144 of upper channel 128 alternate with cross passages 150 of lower channel 130. Each cross passage has a matching diamond cross-sectional shape, which may also be referred to as a rhombus or lozenge. Each side of each diamond shape forms an angle of less than 45 degrees with a vertical line parallel to manufacturing axis 116. Corners of each diamond shape are rounded, in particular top corners 154 and bottom corners 156.

Top corners 154 of cross passages 144 and 150 are formed in top conductive wall 112 by internal heat transfer surfaces. Bottom corners 156 of cross passages 144 and 150 are formed in bottom conductive wall 114 by internal heat transfer surfaces. In other words, cold plate 100 is configured to transfer heat from external heat transfer surface 118 of top conductive wall 112 to coolant fluid in cross passages 144 of upper channel 128 and to coolant fluid in cross passages 150 of lower channel 130 through top corners 154. Similarly, cold plate 100 is also configured to transfer heat from an external heat transfer surface 118 of bottom conductive wall 114 to coolant fluid in cross passages 144 of upper channel 128 and to coolant fluid in cross passages 150 of lower channel 130 through bottom corners 156.

Each channel 128, 130 may be described as contacting both top conductive wall 112 and bottom conductive wall 114. Each channel may also be described as equidistant from external transfer surface 118 of top conductive wall 112 and external transfer surface 118 of bottom conductive wall 114. The channels may thereby provide effective redundant and/or fail-safe cooling systems. In the event of a failure of one channel, the other is configured to effectively cool both sides of cold plate 100.

Figure 7:
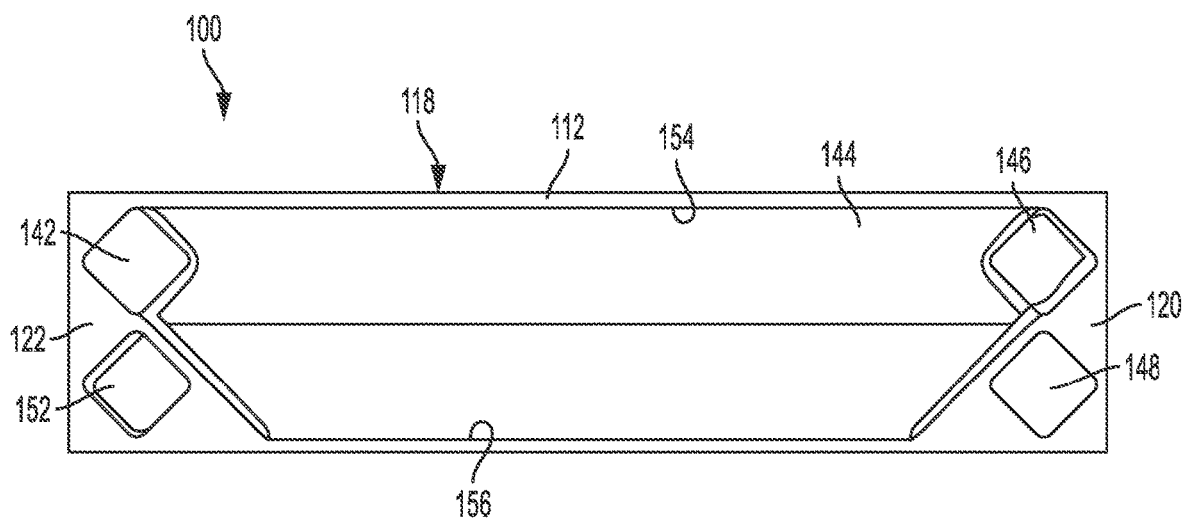
FIG. 7 is a cross sectional view of the cold plate of FIG. 3, along line 7-7

FIG. 7 is a cross-sectional view of cold plate 100 along line 7-7, through a cross passage 144 and facing toward input wall 124. It should be noted that the rest of the plurality of cross passages 144 match the one depicted. Further, the plurality of cross passages 150 are vertically mirrored relative to the depicted cross passage 144, but otherwise matching the depicted cross passage.

As shown, left side-passage 142 and right side-passage 146 each have a diamond cross-sectional shape with four perpendicular sides of equal length and rounded corners. Each side-passage has a height that is approximately half of a greatest height of cross passage 144. Openings in the internal wall structure of cold plate 100 connect cross passage 144 to each side passage.

The cross-sectional shape of cross passage 144 varies across cold plate 100, changing from the elongate diamond shape shown in FIG. 6 to match the square diamond shape of left side-passage 142 and right side-passage 146. Bottom corner 156 rises as the cross passage nears the side-passages, extending up at an angle of approximately 45 degrees to meet a bottom corner of each side-passage.

The diamond cross-sectional shapes of side-passages 142, 146 and cross passages 144, 150 may allow cold plate 100 to be additively manufactured without secondary supports in the inner channels. Each interior surface of upper channel 128 and lower channel 130 may form an angle of 45 degrees or less with a vertical line parallel to the manufacturing axis of the cold plate.

B. Illustrative Top-Fed Diamond Channel Cold Plate

Figure 8:
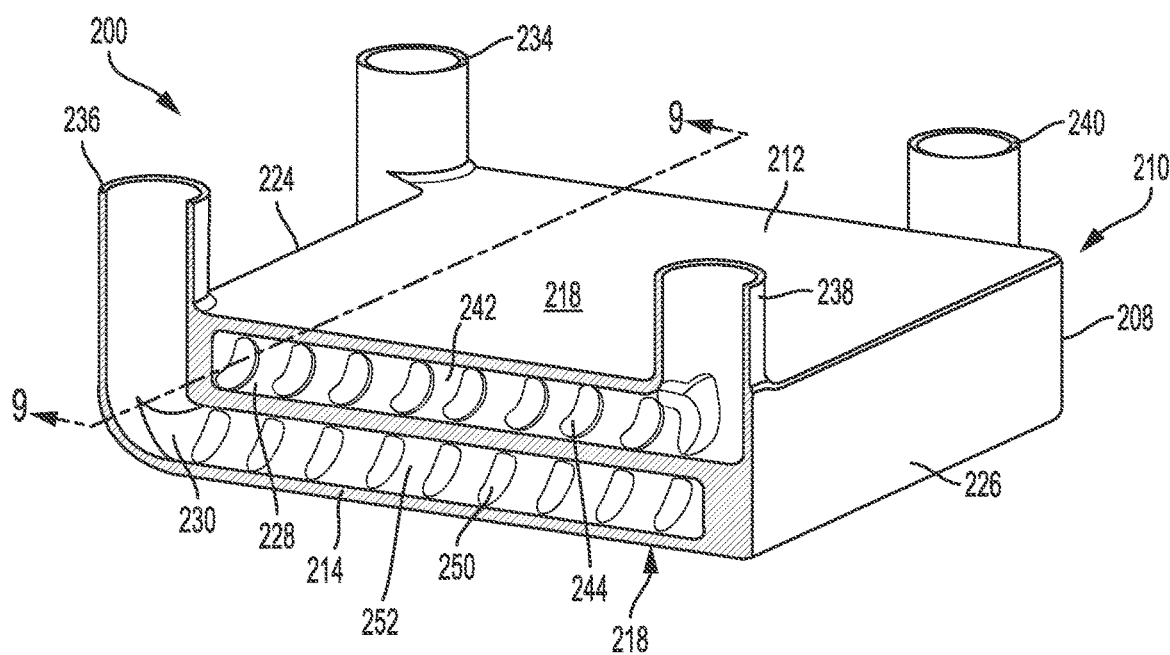
FIG. 8 is a cutaway isometric view of another illustrative cold plate as described herein.
Figure 9:
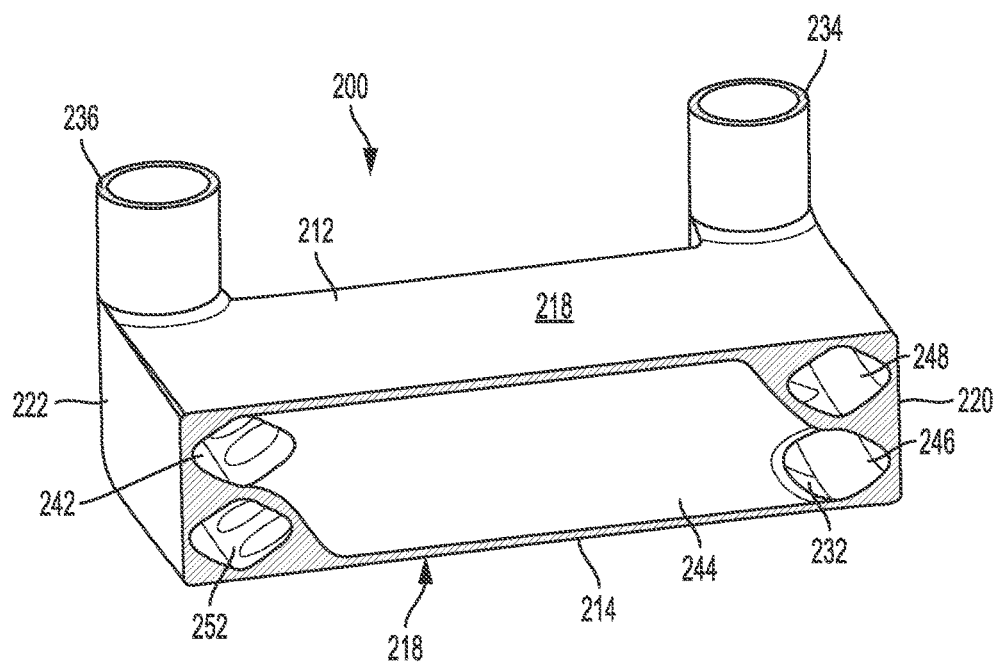
FIG. 9 is a cutaway isometric view of the cold plate of FIG. 8, cut along line 9-9.

As shown in FIGS. 8-9, this section describes another illustrative additively manufactured cold plate 200. Cold plate 200 is an example of cold plate 10, described above. Cold plate 200 is also substantially similar to cold plate 100 described above. Accordingly, similar structures are indicated with corresponding reference numbers.

Cold plate 200 includes a rectangular housing 210 with outer walls 208, including a top conductive wall 212 and a bottom conductive wall 214. Each of the conductive walls 212, 214 has a planar external heat transfer surface 218.

Outer walls 208 further include four side walls: a right wall 220, a left wall 222, an input wall 224, and an output wall 226. The outer walls of housing 210 contain a first inner channel 228 and a second inner channel 230. First channel 228 is separated from second channel 230 by an internal wall structure including a plurality of internal walls 232.

Cold plate 200 also includes two intake ports. A right intake port 234 connects through input wall 224 to first channel 228 and a left intake port 236 connects through the input wall to second channel 230. Similarly, cold plate 200 includes two outtake ports. A left outtake port 238 connects through top conductive wall 212 to first channel 228 and a right outtake port 240 connects through the conductive wall to second channel 230.

Each intake and outtake port extends vertically and perpendicular to external transfer surfaces 218. Intake ports 234 and 236 are disposed against input wall 224, and curve proximate bottom conductive wall 214 to connect in line with the inner channels. Outtake ports 238 and 240 connect to an opening in an upper portion of the corresponding inner channel. Such vertical orientation may facilitate additive manufacturing of the intake and outtake ports without secondary support. In the present example, cold plate 200 is unitary. That is, outer walls 208, internal walls 232, intake ports 234 and 236, and outtake ports 238 and 240 are additively manufactured as a single-piece.

As shown in FIG. 9, first channel 228 includes a right side-passage 246 connected to intake port 234. A plurality of cross-passages 244 branch off at regular intervals from side-passage 246 and extend across cold plate 200 to a left side-passage 242. Left side-passage 242 extends across cold plate 200 to outtake port 238, proximate output wall 226, as shown in FIG. 8.

First channel 228 is configured to direct a flow coolant fluid from intake port 234 along right side-passage 246, some portion of the coolant fluid turning down each cross passage 244. The first channel is further configured to direct the coolant fluid from cross passages 244 into left side-passage 242 and down the right side-passage to outtake port 238. First channel 228 is configured to transfer heat from both external transfer surfaces 218 to the directed flow of coolant fluid.

Second channel 230 is similar to first channel 228, but mirrored. The second channel includes a left side-passage 252 connected to intake port 236. A plurality of cross-passages 250 branch off at regular intervals from side-passage 252 and extend across cold plate 200 to a right side-passage 248. Right side-passage 248 extends across cold plate 200 to outtake port 240, proximate output wall 226.

Second channel 230 is configured to direct a flow of coolant fluid from intake port 236 along left side-passage 252, some portion of the coolant fluid turning down each cross passage 250. The second channel is further configured to direct the coolant fluid from cross passages 250 into right side-passage 248 and down the left side-passage to outtake port 240. Second channel 230 is configured to transfer heat from both external transfer surfaces 218 to the directed flow of coolant fluid.

Each channel 228, 230 may be described as contacting both top conductive wall 212 and bottom conductive wall 214. Each channel may also be described as equidistant from external transfer surface 218 of top conductive wall 212 and external transfer surface 218 of bottom conductive wall 214. The channels may thereby provide effective redundant and/or fail-safe cooling systems. In the event of a failure of one channel, the other is configured to effectively cool both sides of cold plate 200.

FIG. 9 is a cutaway view of cold plate 200 along line 9-9, cut through a cross passage 244 and facing toward input wall 224. It should be noted that the rest of the plurality of cross passages 244 match the one depicted. Cross passages 244 of first channel 228 alternate with cross passages 250 of second channel 230. Each cross passage has a matching diamond cross-sectional shape, which may also be referred to as a rhombus or lozenge. Further, the plurality of cross passages 250 are vertically mirrored relative to the depicted cross passage 244, but otherwise matching the depicted cross passage.

As shown in FIG. 9, left side-passage 242 and right side-passage 246 each have a diamond cross-sectional shape with four perpendicular sides of equal length. The diamond cross-sectional shapes of side-passages 242, 246 and cross passages 244, 250 may allow cold plate 200 to be additively manufactured without secondary supports in the inner channels. Each interior surface of first channel 228 and second channel 230 may form an angle of 45 degrees or less with a vertical line parallel to the manufacturing axis of the cold plate.

Openings in the internal wall structure of cold plate 200 connect cross passage 244 to each side passage. The cross-sectional shape of cross passage 244 varies across cold plate 200, changing from an elongate diamond shape in a central region, to match the square diamond shape of left side-passage 242 and right side-passage 246 at left and right ends. An upper corner rises from right side-passage 246, extending up at an angle of approximately 45 degrees. Similarly, a bottom corner rises to meet left side-passage 242, extending up at an angle of approximately 45 degrees.

C. Illustrative Cooling System

Figure 10:
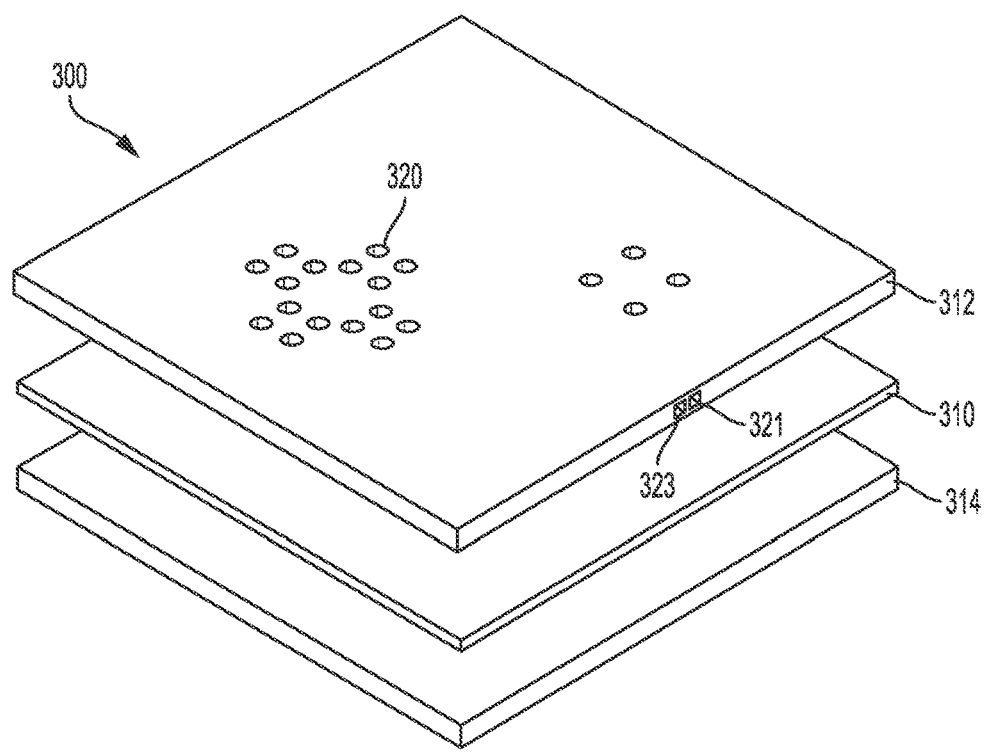
FIG. 10 is a partially exploded view of an illustrative cooling system as described herein.
Figure 11:
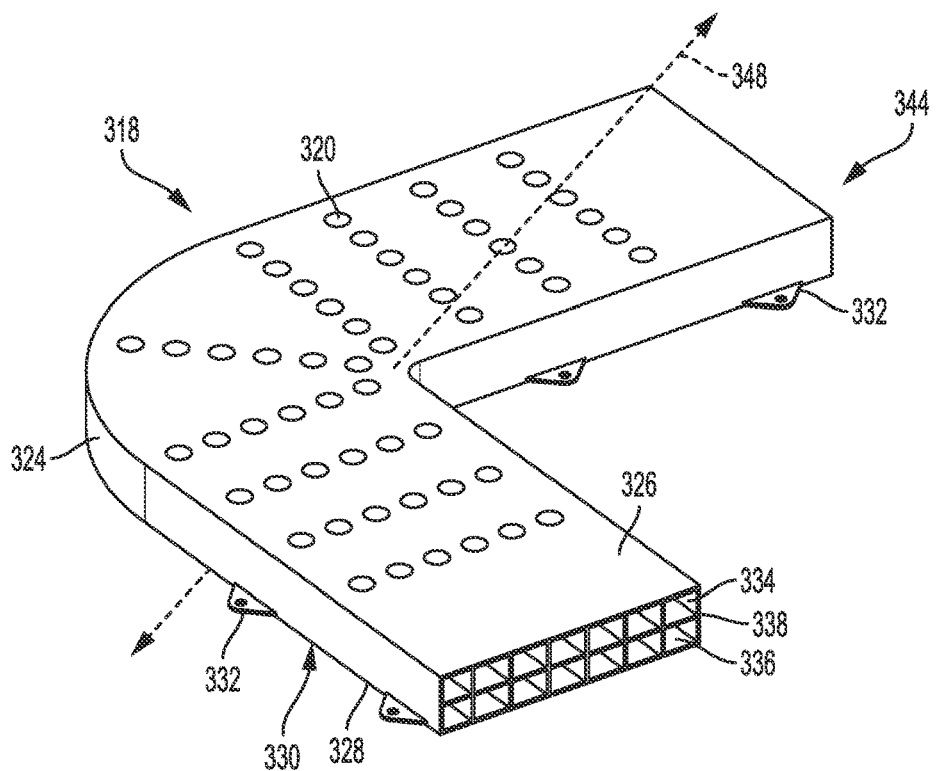
FIG. 11 is an isometric view of an illustrative cold plate quadrant.
Figure 12:
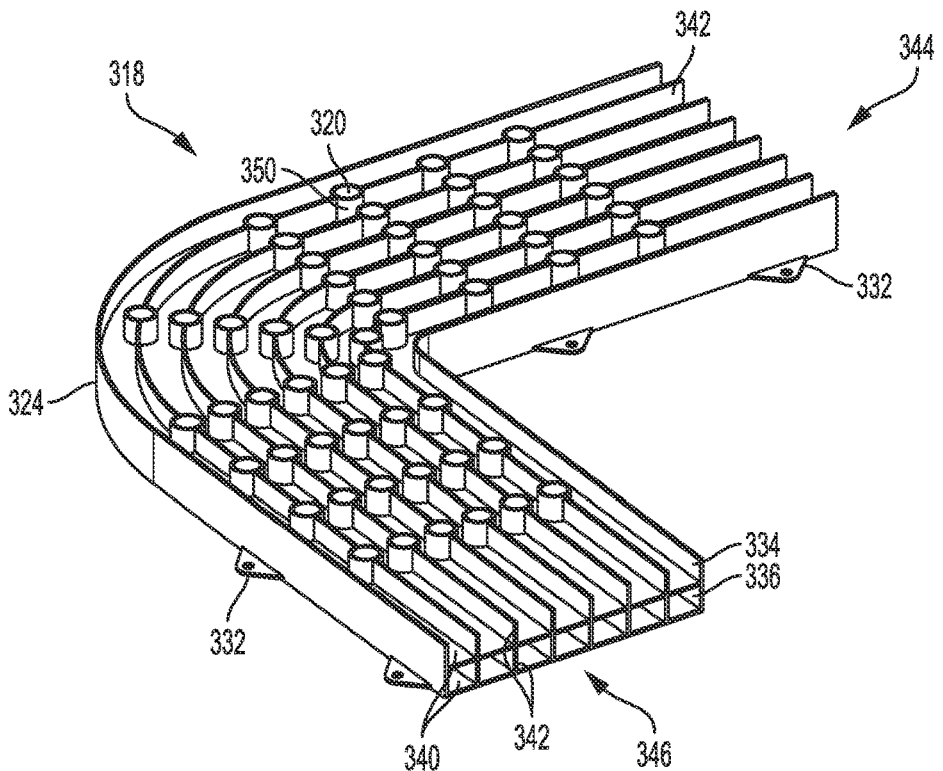
FIG. 12 is a cutaway isometric view of the cold plate quadrant of FIG. 11.

As shown in FIGS. 10-12, this section describes an illustrative cooling system 300. FIG. 10 is a partially exploded view of system 300, with a heat source 310. The heat source may include, but is not limited to, an engine, a battery, a chemical reaction chamber, and/or another heat transfer device. In some examples, heat source 310 may include electronics such as a printed circuit board, a microwave frequency transceiver, and/or a digital phased array. Cooling system 300 may be used in any environment where heat source 310 is located. For instance, the cooling system may be used in a vehicle, on a satellite, or in a manufacturing plant.

Cooling system 300 includes a front cold plate 312 and a back cold plate 314. Heat source 310 is sandwiched between the front and back cold plates, which transfer heat away from two opposing sides of the heat source. Front cold plate 312 may be described as disposed on a front side of the heat source and back cold plate 314 as disposed on a back side of the heat source, relative to a primary orientation of the heat source. In the depicted example, heat source 310 and cold plates 312, 314 are shown as rectangular. The cold plates may be any shape appropriate to heat source 310, and may be disposed on any two surfaces of the heat source. In some examples, additional cold plates may be included in cooling system 300. For instance, the cooling system may include five cold plates configured to contact five of six sides of a heat source having a cubic shape.

Cooling system 300 may be secured to heat source 310 and/or to adjacent structures. Each cold plate 312, 314 may be coupled to the heat source and/or the other cold plate. For example, the heat source may be bonded, fastened, or otherwise secured to each cold plate. In some examples, back cold plate 314 may in turn be coupled to a structural mount of an adjacent structure.

Back cold plate 314 is an example of additively manufactured cold plate 10, including inner channels configured to direct a flow of coolant fluid. In the present example, the back cold plate also includes structural components appropriate to support the heat source and facilitate connection with adjacent structures. Back cold plate 314 is configured to conduct heat away from the back side of heat source 310. The back cold plate may channel fluid from a coolant fluid source, which may be separate from or shared with front cold plate 312.

Front cold plate 312 is another example of additively manufactured cold plate 10, including inner channels configured to direct a flow of coolant fluid. An intake port 321 and an outtake port 323 direct coolant fluid into and out of one side of the cold plate. The inner channels of front cold plate 312 may be laid out in any appropriate pattern, and coolant fluid may be directed in linear, radial, and/or branching flow. In some examples, front cold plate 312 may include a single continuous inner channel, may include two or more vertically stacked channels, and/or may include multiple interwoven channels such as described in cold plates 100 and 200 above.

Front plate 312 further includes a plurality of passages or pass-through apertures 320, extending from a back side to a front side of the cold plate. The apertures are closed to coolant fluid, and separate from the inner channels. Apertures 320 may be configured to allow access to heat source 310 through front cold plate 312. For example, an aperture may be disposed over an infrared sensor, a status-indicator light emitting diode, a system reset button, or a memory card slot. Cables, tubing, fluids, and/or any appropriate structures or components may also pass through apertures 320. For example, heat source 310 may be an electric motor and electrical power may be delivered to heat source 310 by a cable passed through one aperture, while a driveshaft extends from the motor through another aperture.

For another example, front cold plate 312 may include an aperture 320 for each antenna element of a transmitter, aligned with the antenna element. For each such aperture, a corresponding waveguide may be mounted on front cold plate 312 such that the aperture and waveguide cooperatively guide transmissions from the corresponding antenna element of the transmitter. Alternatively or in addition, a waveguide structure may be formed on an inner surface of each aperture 320. In other words, apertures 320 may be configured to allow passage and/or guide transmission of electromagnetic radiation through front cold plate 312.

Some or all of the plurality of apertures 320 in front plate 312 may align with other components, radiation sources, and/or receivers of heat source 310. Front cold plate 312 may be designed for a specific heat source, with a pattern of apertures 320 corresponding to selected components of the heat source.

In the depicted example, front cold plate 312 is shown covering a full extent of an upper surface of heat source 310. In some examples, front cold plate 312 may cover only a limited portion of a surface of the heat source, and cooling system 300 may further include one or more covers. The covers may be configured to protect heat source 310 from environmental effects such dust, weather, or incident radiation. The covers may not be configured to direct a flow of coolant fluid, and therefore may be disposed over portions of heat source 310 that generate limited heat. For example, a cover may be a single layer of aluminum, manufactured separately from front cold plate 312. In some examples, each cover may be additively manufactured as part of front cold plate 312, or may comprise a different material or materials to the cold plate.

Cooling system 300 may be designed according to a specific heat source, transmitter, and/or other equipment. For example, cold plates 312, 314 may be shaped to contact areas of heat source 310 generating significant heat, while the cooling system may include covers appropriate to protect areas of the heat source generating limited heat. Apertures 320 may be located to allow access to selected components of heat source 310.

In some examples, front cold plate 312 may be made up of separately manufactured sections. Each section may include inner channels configured to direct a flow of coolant fluid. In addition to the sections, front cold plate 312 may include bridging structures, to connect the sections such that these inner channels operate in series. In other words, each bridging structure may direct coolant fluid from one section to the next. An interface structure, including an intake port and an outtake port, may be mounted at one or more connections. In some examples, cold plate sections may be connected such that the inner channels of each section remain separate. Each section may channel fluid from a separate coolant fluid source, from an adjacent section, and/or from a shared coolant fluid source.

Assembling front cold plate 312 from separate sections may facilitate replacement in the event of a failure. Print quality may also be improved by limiting the size of any one printed section, avoiding problems such as warping and cracking. In some examples, front cold plate 312 may be manufactured in sections due to size constraints of available printing equipment. In some examples, front cold plate 312 may be manufactured as two pieces, as multiple pieces of differing design, or according to any division appropriate to selected manufacturing equipment and/or cold plate design.

FIGS. 11-12 show an example of a quadrant 318 which, when assembled with three matching quadrants and appropriate connective structures, may form front cold plate 312 of cooling system 300. In the present example, quadrant 318 measures approximately 15 inches by 15 inches and is comprised of laser sintered aluminum alloy. The quadrant includes a housing with outer walls 324, including a front wall 326 and a back wall 328. A planar external heat transfer surface 330 of back wall 328 is configured to contact a front side of heat source 310. Apertures 320 extend through cold plate quadrant 318 perpendicular to external heat transfer surface 330, through both front wall 326 and back wall 328.

Along an edge of cold plate quadrant 318, structural attachment features 332 are disposed. In the present example, the features include tabs extending from a side wall of the quadrant. The tabs each include a fastener aperture, appropriate for fastening cold plate quadrant 318 to an adjacent quadrant. In some examples, attachment features 332 may be used to connect the quadrant to other components of cooling system 300, and/or a support structure. Cold plate quadrant 318 may include any structural attachment features, disposed at any point on the quadrant. For example, an outer wall 324 of the quadrant may be shaped to form an I-beam for connection to other structural beams of a satellite. Structural attachment features 332 may be additively manufactured as part of quadrant 318, and/or may be add as part of post-processing.

Outer walls 324 contain a first layer 334 and a second layer 336, divided by an internal wall 338. As shown in FIG. 12, a cutaway view of the quadrant, each layer is divided into plurality of channels 340 by ribs 342. Each layer is configured to direct multiple flows of coolant fluid parallel to external heat transfer surface 330 of back wall 328. In some examples, channels 340 may branch or interconnect, outer walls 324 may include a third layer, and/or quadrant 318 may include any appropriate number and configuration of layers and channels.

In the depicted example, channels 340 are generally rectangular in cross-section. To facilitate additive manufacture without use of internal printing supports, quadrant 318 has a non-vertical manufacturing axis 348, shown in FIG. 11. In other words, quadrant 318 is manufactured in an orientation such that channels 340 have a diamond cross-sectional shape relative to manufacturing axis 348. The axis extends at about 50 degrees relative to vertical. Manufacturing axis 348 may be selected according to a spacing of ribs 342, such that each planar surface of quadrant 318 extends at less than approximately 45 degrees relative to the manufacturing axis. That is, manufacturing axis 348 may be oriented such that outer walls 324, internal wall 338, and ribs 342 do not form any abrupt overhangs.

In order to manufacture quadrant 318 in such an orientation, limited secondary supports may be required. For example, a support column may be printed between a base plate of a printer and back wall 328. Such simple external supports may be easily removed subsequent to printing without impacting integrity or print quality of quadrant 318. In some examples, channels 340 may be defined by internal wall 338 and ribs 342 to have a diamond cross section relative to vertical. In such examples, manufacturing axis 348 may be approximately vertical and cold plate quadrant 318 may be manufactured entirely without secondary supports.

As shown in FIG. 12, each channel 340 follows a curved, bent, or cornered path from an input 344 to an output 346. In the present example, the input and output are open ends of cold plate quadrant 318, configured for connection to a bridging component. When assembled to form the front cold plate, input 344 of one quadrant is connected to an output 346 of another quadrant such that together the four quadrants operate in series with a single effective input and output. Each bridging component may include a perpendicular channel connected to the input or output such that channels 340 function similarly to the cross passages described in cold plate 100. Any effective structures or fluid connections may be used to assemble quadrant 318 into front cold plate 312. The front cold plate may be configured for any effective coolant fluid flow pattern.

In the present example, first layer 334 of cold plate quadrant 318 is spaced from back wall 328. That is, second layer 336 is closer to external heat transfer surface 330 than first layer 334. Accordingly, first layer 334 may be configured to serve as a backup or fail-safe system for second layer 336. During normal operation, coolant fluid flowing through second layer 336 may absorb heat directly through back wall 328 from the heat source. In the event of a failure, heat may be conducted from back wall 328 through ribs 342 of second layer 336 to internal wall 338. Coolant fluid flowing through first layer 334 may then absorb heat through internal wall 338.

Cold plate quadrant 318 further includes a plurality of bosses 350, each having a central aperture 320. Each boss extends between front wall 326 and back wall 328, perpendicular to the front and back walls. The bosses extend through first layer 334, internal wall 338, and second layer 336. The bosses may also be referred to as cylindrical passages, internal wall structures, and/or integrated waveguides. Apertures 320 may be described as passages separated from the first and second layers by an internal wall structure.

In the present example, all bosses 350 and apertures 320 are circular and of matching size. In some examples, bosses 350 may have a different shape from apertures 320 or shape and/or size may vary among bosses 350 and/or apertures 320. In some examples, bosses 350 may extend at a non-perpendicular angle relative to the front and back walls, to align with a component or function of the heat source, such as a transmission or reception direction of a transceiver. For a transceiver, dimensions of the apertures may be selected according to one or more transmission frequencies. For example, apertures 320 may be approximately a centimeter in diameter, appropriate to act as a waveguide for microwave frequencies.

Each of the plurality of bosses 350 is disposed on a rib 342 between two channels. In some examples, a boss may be disposed within a channel 340. Where a boss 350 is disposed on a rib 342, the boss forms part of the rib separating the two adjacent channels 340. Each aperture 320 is separated from coolant fluid in the surrounding or adjacent channels by the corresponding boss 350. Positions of apertures 320 may be selected according to the layout of the heat source. Ribs 342 may be accordingly positioned and curved relative to bosses 350 such that no gaps are formed that are too small to be adequately resolved during additive manufacture.

D. Illustrative Method of Additive Manufacture

Figure 13:
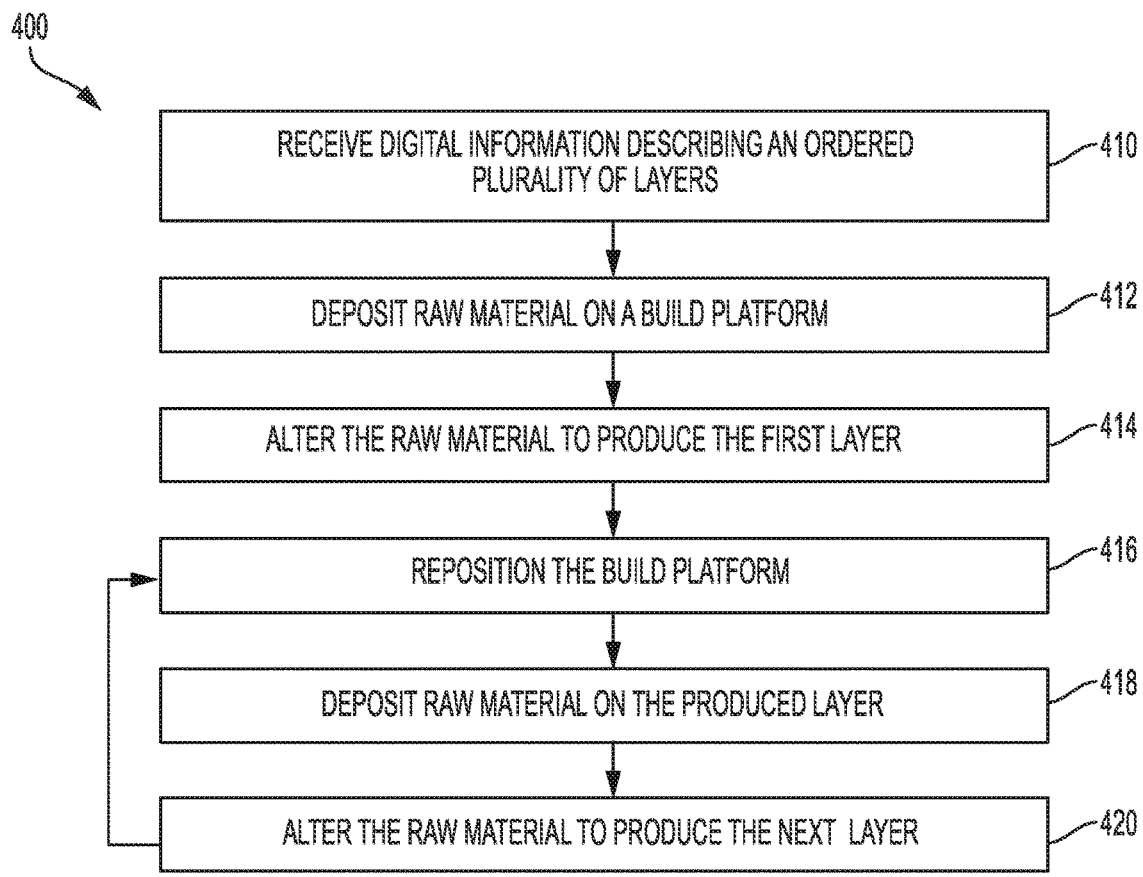
FIG. 13 is a flow chart depicting steps of an illustrative method of additive manufacture according to the present teachings.

This section describes steps of an illustrative method for additive manufacture of a workpiece; see FIG. 13. Aspects of an illustrative additive manufacturing device depicted in FIG. 14 may be utilized in the method steps described below. Where appropriate, reference may be made to components and systems that may be used in carrying out each step. These references are for illustration, and are not intended to limit the possible ways of carrying out any particular step of the method.

Additive Manufacturing (AM) is quickly gaining popularity in many industries as a method of rapid production at relatively low cost. AM, sometimes known as 3D printing, can be used to create a solid object from a 3D model by building the object incrementally. AM typically applies a raw material that is then selectively joined or fused to create the desired object. The raw material is typically applied in layers, where the thickness of the individual layers can depend upon the particular techniques used.

Often the raw material is in the form of granules or powder, applied as a layer and then selectively fused by a heat source. In many cases, the upper surface of a bed of such material is fused, and the growing workpiece is then lowered slightly into the bed itself. A fresh layer of raw material is then applied to the bed, and the next layer is fused onto the previous one. The granular raw material may include for example thermoplastic polymer, metal powder, metal alloy powder, or ceramic powder, which may be fused using a computer-controlled heat source, such as a scanning laser or scanning electron beam. Exemplary methods include selective laser melting (SLM) direct metal laser sintering (DMLS), selective laser sintering (SLS), fused deposition modelling (FDM), and electron beam melting (EBM) among others.

FIG. 13 is a flowchart illustrating steps performed in an illustrative additive manufacturing method, and may not recite the complete process or all steps of the method. Although various steps of method 400 are described below and depicted in FIG. 13, the steps need not necessarily all be performed, and in some cases may be performed simultaneously or in a different order than the order shown.

Figure 14:
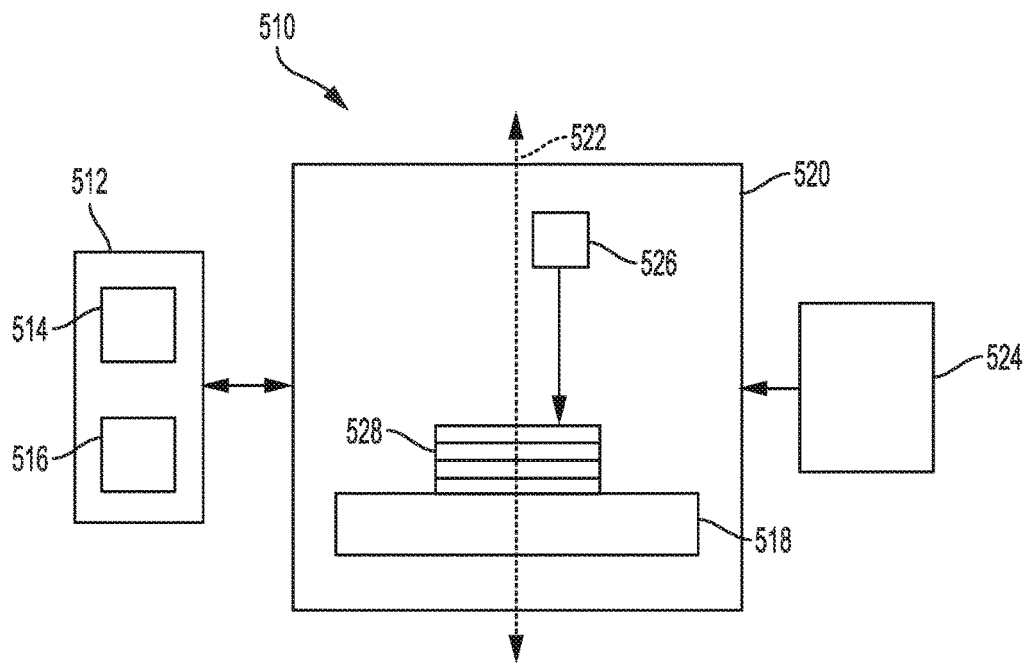
FIG. 14 is a schematic diagram of an illustrative additive manufacturing apparatus as described herein.

At step 410, digital information describing an ordered plurality of layers is received. The digital information may be received by a computer controller 512 of an additive manufacturing device 510 as depicted in FIG. 14. The additive manufacturing device may also be referred to as a printer, or a fabricator. Computer controller 512 may include any data processing system configured to receive digital design information and control functions of printer 510. The illustrative computer controller shown in FIG. 14 includes a processor 514 for controlling printer functions and memory 516 for storing received data.

The received information may include geometric data and/or design details for a plurality of two-dimensional patterns that constitute layers of a three-dimensional object, where the three-dimensional object is a workpiece 528 to be manufactured. For example, workpiece 528 may be a cold plate as described above. The layers may also be described as cross-sections or slices. The plurality of layers is ordered, such that the layers may be numbered or organized from a first layer to a last layer.

Step 412 of method 400 includes depositing raw material on a build platform 518 located in a building environment 520 of printer 510. The build platform may include a support moveable by computer controller 512 along a manufacturing axis 522. The build platform may have a planar surface perpendicular to manufacturing axis 522.

The raw material may be any material appropriate to additive manufacturing, typically a fluid or powder and including but not limited to photopolymer resin, thermoplastic, plaster, ceramic, and metal. For a cold plate as described above, the raw material may be an alloy powder of a conductive metal such as aluminum or copper. The material may be distributed from a raw material source 524 such as a hopper, a tank, or a powder bed. For example, aluminum powder may be swept from a powder bed over build platform 518 by a brush arm actuated by computer controller 512.

The raw material may be distributed evenly over build platform 518, or may be deposited in a selected pattern. Depositing may be done under control of computer controller 512. In some examples, build platform 518 may be submerged in raw material and depositing may be accomplished by gravity or fluid pressure. In some examples, a print head 526 connected to raw material source 524 may deposit the raw material in a pattern corresponding to the first layer of the ordered plurality of layers.

At step 414, the raw material is altered to produce the first layer. In other words, a physical change is induced the deposited material, according to the design information describing the first layer of the ordered plurality of layers and as directed by the computer controller 512, to realize the first layer as a physical object on the build platform.

The material may be acted on by a print head 526 of printer 510, controlled by computer controller 512. For example, the print head may include a laser that cures a photopolymer by exposure to light. For the cold plates described above, print head 526 may be a laser that sinters a metal powder by exposure to heat, or a heated printer extruder head that delivers a continuous filament of thermoplastic metal. The print head may be directed by computer controller 512 to follow a path delineated in the received digital information for the first layer, and/or a path calculated by processor 514 based on the received digital information.

Step 416 includes repositioning the build platform. In some examples, build platform 518 may start a selected distance from print head 526. The selected distance may be determined by the procedures performed by the print head. Subsequent to production of a layer, the build platform may be repositioned by computer controller 512 along manufacturing axis 522 away from print head 526 by the layer's thickness. That is, the build platform may be moved such that a top surface of the produced layer is the selected distance from print head 526.

In some examples, build platform 518 may start in alignment with another element of printer 510 such as a raw material distribution component. Subsequent to production of a layer, the build platform may be repositioned by computer controller 512 along manufacturing axis 522 such that a top surface of the produced layer is aligned with the other element of printer 510. In some examples, at step 416 print head 526 may be repositioned instead of or in addition to build platform 518. In some examples, step 416 may be skipped.

At step 418, raw material is deposited on the layer produced in the preceding step of method 400. As described for step 412, the raw material may be any appropriate material and may be deposited any appropriate manner. At step 420, the raw material is altered to produce the next layer as previously described for step 414.

Steps 416 through 420 may be repeated to produce each layer of the plurality of layers of the received digital information, until the last layer is produced. The produced first through last layers may then comprise workpiece 528 as described in the received digital information. The workpiece may be removed from the printer and post-processed as desired. For example, a cold plate as described above may be machined from a build plate of the build platform, fine details or smooth surfaces of the exterior of the cold plate may be further finished by machining or other methods, and then intake and outtake ports may be installed.

E. Illustrative Method of Manufacturing a Cold Plate

Figure 15:
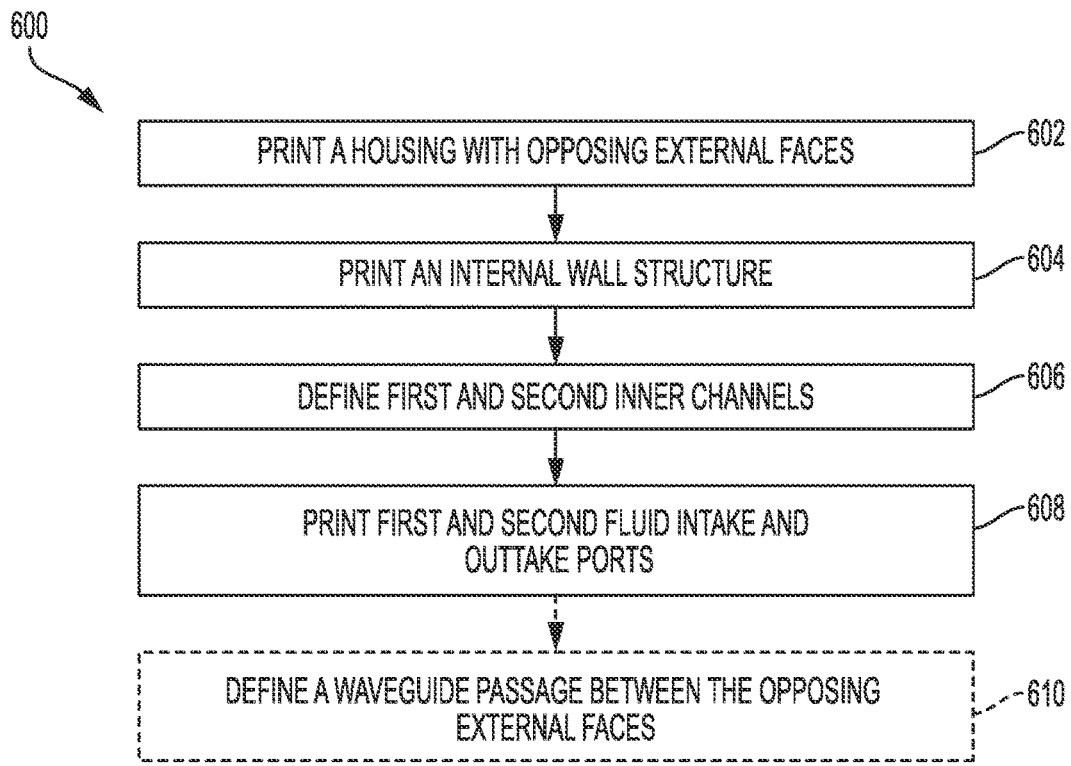
FIG. 15 is a flow chart depicting steps of an illustrative method for additively manufacturing a cold plate according to the present teachings.

This section describes steps of an illustrative method 600 for manufacturing a cold plate; see FIG. 15. Aspects of cold plates, cold plate design, additive manufacturing methods, or additive manufacturing devices described above may be utilized in the method steps described below. Where appropriate, reference may be made to components and systems that may be used in carrying out each step. These references are for illustration, and are not intended to limit the possible ways of carrying out any particular step of the method.

FIG. 15 is a flowchart illustrating steps performed in an illustrative method, and may not recite the complete process or all steps of the method. Although various steps of method 600 are described below and depicted in FIG. 15, the steps need not necessarily all be performed, and in some cases may be performed simultaneously or in a different order than the order shown.

Conventional part designs used for machining or other traditional methods of manufacturing a cold plate may be inefficient or even unworkable for additive manufacture. Depending on the process and material used, unsupported features may collapse, delicate features may be rendered with insufficient clarity, and/or wearing and cracking may occur. Internal channels and complex geometries generally rely on secondary printing supports that require expensive and time-consuming removal by hand. New cold plate designs and methods of manufacturing cold plates are needed to maintain the functionality of conventional cold plates while enabling efficient use of AM methods.

Method 600 is an example of such a new method. At step 602, the method includes printing a housing with opposing external faces. The housing may comprise a thermally conductive material, and may be sized to correspond to a heat source. The opposing external faces may be configured to conduct heat from the heat source, being planar or of any appropriate shape.

Printing, of step 602 and of subsequent steps, may be done according to an additive manufacturing method such as method 400 described above. In particular, printing may be done by Direct Metal Laser Sintering (DMLS) or metal fused deposition modeling of an aluminum or copper alloy. The housing may have an axis perpendicular to the opposing external faces, which may coincide with a vertical direction or manufacturing axis of the additive manufacturing method. In other words, the housing may be printed with the external faces flat. Printing may be carried out without use of secondary supports.

Step 604 includes printing an internal wall structure. The internal wall structure may be disposed between the opposing external faces, and contained by the housing.

The internal wall structure may include a plurality of surfaces, each downward-facing surface being disposed at an angle of less than approximately 45 degrees relative to the manufacturing axis.

At step 606, method 600 includes defining first and second inner channels. The inner channels may be contained in the housing and separated by the internal wall structure. The first and second inner channels may be shaped to avoid a need for internal secondary supports. For example, the channels may have diamond cross-sectional shapes.

The inner channels may have complex paths, also defined by the internal wall structure. Each inner channel may extend from an input to an output, some portion of the channel extending parallel to one or both of the opposing external faces. Each inner channel may be configured to direct a separate flow of fluid through the housing, such that heat conducted by the opposing external faces is transferred into the fluid.

Step 608 includes printing first and second fluid intake and outtake ports. The first intake and outtake ports may be in fluid communication with the first inner channel, and the second intake and outtake ports may be in fluid communication with the second inner channel. The intake ports may be configured for connection to a shared fluid supply and/or to separate fluid supplies. Each intake port may be configured to direct flow of the fluid through an outer wall of the housing into the corresponding inner channel.

Similarly, the outtake ports may be configured for connected to a shared fluid exhaust system and/or separate fluid exhaust systems. Each outtake port may be configured to direct flow of the fluid through an outer wall of the housing out of the corresponding inner channel.

In some examples, step 608 may instead include printing connections for intake and outtake ports and/or apertures through outer walls of the housing appropriate to receive ports. The intake and outtake ports may be additively manufactured, post-processed, and/or separately installed.

An optional step 610 includes defining a waveguide passage between the opposing external faces. The passage may be defined by the internal wall structure printed in step 604, or step 610 may include printing additional structures. Any number of additional waveguide passages may be similarly defined.

The waveguide passage may be circular, rectangular, or any appropriate shape and may extend perpendicular to the opposing external faces. An internal dimension of the passage may be selected according to a transmission or reception frequency of the heat source. The passage may be separated from the first and second inner channels and the flow of fluid.

In some examples, method 600 may further include steps to post-process the cold plate, such as machining, drilling, and/or surface finishing. Post-processing may include assembly of separately printed sections of the cold plate, such as the quadrants described above for illustrative transmitter cooling system 300. Cold plate sections may be assembled such that channels of each section connect to form the first and second channels of the cold plate. Assembly may include bonding, fastening, and/or otherwise securing cold plate sections.

F. Illustrative Method of Removing Heat from a Microwave Transmitter

Figure 16:
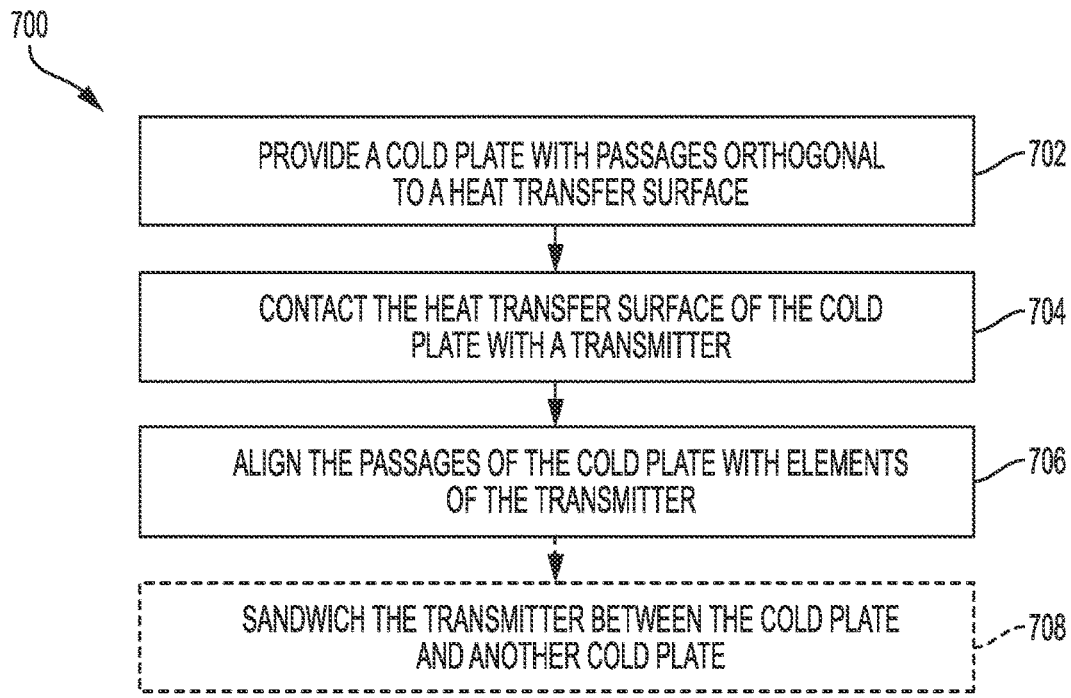
FIG. 16 is a flow chart depicting steps of an illustrative method for removing heat from a transmitter according to the present teachings.

This section describes steps of an illustrative method 700 for removing heat from a microwave transmitter; see FIG. 16. Aspects of cold plates described above may be utilized in the method steps described below. Where appropriate, reference may be made to components and systems that may be used in carrying out each step. These references are for illustration, and are not intended to limit the possible ways of carrying out any particular step of the method.

FIG. 16 is a flowchart illustrating steps performed in an illustrative method, and may not recite the complete process or all steps of the method. Although various steps of method 700 are described below and depicted in FIG. 16, the steps need not necessarily all be performed, and in some cases may be performed simultaneously or in a different order than the order shown.

At step 702, the method includes providing a cold plate with passages orthogonal to a heat transfer surface. Such a cold plate may be manufactured according to method 600, described above. The front cold plate of transmitter cooling system 300 described above is an example of such a cold plate. The cold plate may include a housing and at least one internal channel, the internal channel being configured to direct a flow of fluid through the cold plate. The cold plate may be configured to conduct heat from the heat transfer surface through the housing to the fluid in the internal channel.

The provided cold plate may also be configured for a selected transmitter. For example, the passages may be disposed to correspond to positions of radiating elements of the transmitter. For another example, the heat transfer surface may be of a size and shape matching a heat generating portion of the transmitter.

Step 704 includes contacting the heat transfer surface of the cold plate with a transmitter. The cold plate may directly or indirectly contact the transmitter, but may be in thermal communication with the transmitter. For example, thermal paste may be disposed between the heat transfer surface and the transmitter to improve conduction. Once in contact, the heat transfer surface may conduct heat away from the transmitter to fluid flowing through the cold plate.

Step 706 includes aligning the passages of the cold plate with elements of the transmitter. The passages may be aligned with radiating elements of the transmitter such as exciters or antennas. The cold plate may thereby allow transmission from the transmitter that might otherwise be blocked by conductive material or fluid of the cold plate. In some examples, the passages may be configured to act as waveguides for transmitted signals.

An optional step 708 includes sandwiching the transmitter between the cold plate and another cold plate. In some examples, the additional cold plate may include a heat transfer surface without orthogonal passages. The additional cold plate may accordingly be disposed in contact with a portion of the transmitter that does not include radiating elements. In some examples, both cold plates may include orthogonal passages and may be disposed in contact with radiating portions of the transmitter.

Illustrative Combinations and Additional Examples

This section describes additional aspects and features of an additively manufactured cold plate, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. An additively manufactured cold plate, comprising:
an enclosure portion including outer walls, the outer walls containing a first inner channel configured to direct flow of a coolant fluid,
a first fluid intake port connected to the first inner channel, the first fluid intake port configured to direct flow of a coolant fluid through an outer wall of the enclosure portion into the first inner channel, and
a first fluid outtake port connected to the first inner channel, the first fluid outtake port configured to direct flow of a coolant fluid through an outer wall of the enclosure portion out of the first inner channel, wherein the first inner channel is defined by internal walls, the enclosure portion and the internal walls forming a single additively manufactured unit.

A1. The cold plate of A0, wherein the enclosure portion contains a second inner channel configured to direct flow of coolant fluid, the second inner channel being connected to a second fluid intake port and a second fluid outtake port, the first and second inner channels being isolated from each other.

A2. The cold plate of A1, wherein each of the first and second intake ports is connected to a separate coolant fluid source.

A3. The cold plate of any of A1-A2, wherein each of the first and second intake ports is connected to a separate pump device configured to deliver coolant fluid into the cold plate.

A4. The cold plate of any of A1-A3, wherein the enclosure portion has first and second opposing heat transfer sides, each of the first and second inner channels being equidistant from the first and second heat transfer sides.

A5. The cold plate of any of A1-A3, wherein the enclosure portion has first and second opposing heat transfer sides, the first inner channel being closer to the first heat transfer side than the second heat transfer side, the second inner channel being closer to the second heat transfer side than the first heat transfer side.

A6. The cold plate of any of A0-A5, wherein the enclosure portion has first and second opposing heat transfer sides, the first inner channel being equidistant from the first and second heat transfer sides.

A7. The cold plate of any of A0-A6, wherein the first inner channel has a diamond shaped cross-section configured to be manufactured by additive manufacturing without any need for secondary supports.

A8. The cold plate of any of A0-A7, wherein the enclosure portion has first and second opposing planar sides parallel to a direction of fluid flow through the first inner channel, and a first passage from the first planar side to the second planar side configured to guide microwave transmission through the cold plate, wherein the passage has an internal wall structure separating the passage from the inner channel.

A9. The heat transfer device of A0, further including a structural attachment feature, wherein the enclosure portion, the internal walls, and the structural attachment feature form a single additively manufactured unit.

B0. A heat dissipation device, comprising:
a housing having a planar heat transfer face, an internal wall structure defining a first channel inside the housing configured to remove heat from the heat transfer face, the housing and internal wall structure forming a single additively manufactured unit.

B1. The heat dissipation device of B0, wherein the internal wall structure defines a second channel inside the housing configured to remove heat from the heat transfer face.

B2. The heat dissipation device of B1, wherein the first and second channels are configured to alternate removing heat from the heat transfer face.

B3. The heat dissipation device of B1, wherein the first and second channels are configured to additively remove heat from the heat transfer face.

C0. A method of manufacturing a heat dissipation device, comprising:
printing a first housing having an external heat transfer face, and an internal wall structure defining a first inner channel configured for cooling the heat transfer face.

C1. The method of C0, wherein the first housing and internal wall structure are formed of a single additively manufactured unit.

C2. The method of any of C0-C1, further comprising:
printing a first fluid intake port connected to the first inner channel, configured to direct flow of a coolant fluid through an outer wall of the first housing into the first inner channel, and
printing a first fluid outtake port connected to the first inner channel, configured to direct flow of a coolant fluid through an outer wall of the first housing out of the first inner channel.

C3. The method of any of C0-C2, wherein the printing step includes:
defining a second inner channel configured for cooling the heat transfer face, the first and second inner channels being isolated from each other.

C4. The method of any of C0-C3, wherein the housing has a second external face parallel and opposite from the external heat transfer face, the printing step including:
defining a passage from the external heat transfer face to the second external face, the passage being configured to guide microwave transmission through the heat dissipation device.

C5. The method of any of C0-C4, further comprising:
printing a second housing having an external heat transfer face, and an internal wall structure defining a first inner channel configured for cooling the heat transfer face, wherein the second housing is configured for assembly with the first housing on opposite sides of an electronic circuit device.

D0. A method of removing heat from a microwave transmission device, comprising:
providing a first cold plate having a heat transfer surface and an inner wall structure defining a first channel configured to cool the heat transfer surface, and a plurality of passages running through the first cold plate orthogonal to the heat transfer surface,
contacting the heat transfer surface of the first cold plate to a microwave transmission device, and aligning the passages of the first cold plate with microwave emitters on the microwave transmission device.

D0. The method of D0, further comprising:
sandwiching the microwave transmission device between the first cold plate and a second cold plate, each of the first and second cold plates being manufactured by additive manufacturing.

D2. The method of any of D0-D1, wherein the providing step includes:
printing the first cold plate including the heat transfer surface and the inner wall structure.

E0. A cold plate, comprising:
a housing having a planar heat transfer face,
an internal wall structure forming a first channel inside the housing configured to conduct heat from the heat transfer face to a fluid, the housing and internal wall structure forming a single additively manufactured unit.

E1. The cold plate of E0, wherein the internal wall structure defines a second channel inside the housing configured to conduct heat from the heat transfer face to a fluid.

E2. The cold plate of E1, wherein the first and second channels are configured to alternate removing heat from the heat transfer face.

E3. The cold plate of any of E1-E2, wherein the first and second channels are configured to additively remove heat from the heat transfer face.

E4. The cold plate of any of E1-E3, wherein the internal wall structure forms at least one passage through the cold plate, perpendicular to the heat transfer face, isolated from the first channel and configured for guiding radio transmission through the cold plate.

F0. A method of manufacturing a cold plate, comprising:
printing a first housing having an external heat transfer face, and an internal wall structure defining a first inner channel configured to channel fluid for cooling the heat transfer face.

F1. The method of F0, wherein the first housing and internal wall structure are formed of a single additively manufactured unit.

F2. The method of any of F0-F1, further comprising:
printing a first fluid intake port connected to the first inner channel, configured to direct flow of a coolant fluid through an outer wall of the first housing into the first inner channel, and
printing a first fluid outtake port connected to the first inner channel, configured to direct flow of a coolant fluid through an outer wall of the first housing out of the first inner channel.

F3. The method of any of F0-F2, wherein the printing step includes:
forming a second inner channel configured for cooling the heat transfer face, the first and second inner channels being isolated from each other.

F4. The method of any of F0-F3, wherein the first housing has a second external face parallel and opposite the external heat transfer face, the printing step including:
defining a passage from the external heat transfer face to the second external face, the passage being configured to guide radio transmission through the cold plate.

F5. The method of any of F0-F4, further comprising:
printing a second housing having an external heat transfer face, and an internal wall structure defining a first inner channel configured for cooling the heat transfer face, wherein the second housing is configured for assembly with the first housing on opposite sides of an electronic circuit device.

Advantages, Features, and Benefits

The different embodiments and examples of the additively manufactured cold plates described herein provide several advantages over known solutions for thermal management of electronics. For example, illustrative embodiments and examples described herein allow manufacture of a cold plate with reduced manual assembly.

Additionally, and among other benefits, illustrative embodiments and examples described herein allow manufacture of a cold plate with highly complex internal channels, including fail safe redundant loops.

Additionally, and among other benefits, illustrative embodiments and examples described herein allow a cold plate with channels formed in a unitary structure, without joins or fastenings.

Additionally, and among other benefits, illustrative embodiments and examples described herein may have improved operational reliability.

No known system or device can perform these functions, particularly without internal secondary printing supports. However, not all embodiments and examples described herein provide the same advantages or the same degree of advantage.

Conclusion

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. An additively manufactured heat transfer device, comprising:
an enclosure portion including outer walls, the outer walls containing a first inner channel configured to direct flow of a coolant fluid,
a first fluid intake port connected to the first inner channel, the first fluid intake port configured to direct flow of a coolant fluid through an outer wall of the enclosure portion into the first inner channel,
a first fluid outtake port connected to the first inner channel, the first fluid outtake port configured to direct flow of the coolant fluid through an outer wall of the enclosure portion out of the first inner channel, wherein the first inner channel is defined by internal walls, the enclosure portion and the internal walls forming a single, monolithic additively manufactured unit, and
at least one passage configured to guide electromagnetic signals through the heat transfer device.

2. The heat transfer device of claim 1, wherein the enclosure portion contains a second inner channel configured to direct flow of a coolant fluid, the second inner channel being connected to a second fluid intake port and a second fluid outtake port, the first and second inner channels being isolated from each other.

3. The heat transfer device of claim 2, wherein the enclosure portion has first and second opposing heat transfer surfaces, the first inner channel being closer to the first heat transfer surface than the second heat transfer surface, the second inner channel being closer to the second heat transfer surface than the first heat transfer surface.

4. The additively manufactured heat transfer device of claim 2, wherein the first and second inner channels are configured to additively remove heat from an external heat transfer surface.

5. The heat transfer device of claim 1, further including a structural attachment feature, wherein the enclosure portion, the internal walls, and the structural attachment feature form a single additively manufactured unit.

6. The heat transfer device of claim 1, wherein the enclosure portion has first and second opposing planar sides parallel to a direction of fluid flow through the first inner channel, wherein the at least one passage is from the first planar side to the second planar side and is configured to guide microwave transmission through the heat transfer device, and wherein the at least one passage has an internal wall structure separating the at least one passage from the first inner channel.

7. The additively manufactured heat transfer device of claim 1, wherein the at least one passage through the heat transfer device extends from a first heat transfer face to a second external face, perpendicular to the first heat transfer face and isolated from the first inner channel.

8. The additively manufactured heat transfer device of claim 1, wherein the enclosure portion includes a second, opposing heat transfer surface.

9. The additively manufactured heat transfer device of claim 1, wherein the at least one passage is configured to guide radio transmission through the heat transfer device.

10. A heat transfer device, comprising:
a housing having a planar heat transfer face, and
an internal wall structure forming a first channel inside the housing configured to conduct heat from the heat transfer face to a fluid, the housing and internal wall structure forming a single additively manufactured unit,
wherein the internal wall structure forms at least one passage through the heat transfer device, perpendicular to the heat transfer face, isolated from the first channel and configured for guiding radio transmission through the heat transfer device.

11. The heat transfer device of claim 10, wherein the internal wall structure defines a second channel inside the housing configured to conduct heat from the heat transfer face to a fluid.

12. The heat transfer device of claim 11, wherein the first and second channels are configured to additively remove heat from the heat transfer face.

13. The heat transfer device of claim 10, further including a first fluid intake port and a first fluid outtake port connected to the first channel and configured to direct a flow of a coolant fluid through an outer wall of the housing.

14. The heat transfer device of claim 10, further including a structural attachment feature, wherein the housing, the internal wall structure, and the structural attachment feature form a single additively manufactured unit.

15. The heat transfer device of claim 10, wherein the at least one passage is configured to guide microwave transmission through the heat transfer device.

16. A method of manufacturing a heat transfer device, comprising:
printing a first housing having an external heat transfer face, and an internal wall structure defining a first inner channel configured to channel fluid for cooling the heat transfer face, and defining at least one passage through the heat transfer device perpendicular to the heat transfer face and isolated from the first inner channel,
wherein the at least one passage is configured to guide radio transmission through the heat transfer device, and the first housing and internal wall structure are formed of a single additively manufactured unit.

17. The method of claim 16, further comprising:
printing a first fluid intake port connected to the first inner channel, configured to direct flow of a coolant fluid through an outer wall of the first housing into the first inner channel, and
printing a first fluid outtake port connected to the first inner channel, configured to direct flow of a coolant fluid through an outer wall of the first housing out of the first inner channel.

18. The method of claim 16, wherein the printing step includes:
forming a second inner channel configured for cooling the heat transfer face, the first and second inner channels being isolated from each other.

19. The method of claim 16, wherein the first housing has a second external face parallel and opposite the external heat transfer face, and the passage extends from the external heat transfer face to the second external face.

20. The method of claim 16, further comprising:
printing a second housing having an external heat transfer face, and an internal wall structure defining a first inner channel configured for cooling the heat transfer face, wherein the second housing is configured for assembly with the first housing on opposite sides of an electronic circuit device.

* * * * *